US006956411B1

(12) United States Patent
Holloway

(10) Patent No.: US 6,956,411 B1
(45) Date of Patent: Oct. 18, 2005

(54) CONSTANT $R_{ON}$ SWITCH CIRCUIT WITH LOW DISTORTION AND REDUCTION OF PEDESTAL ERRORS

(75) Inventor: Peter R. Holloway, Groveland, MA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/402,080

(22) Filed: Mar. 27, 2003

(51) Int. Cl.[7] .............................................. H03K 17/00
(52) U.S. Cl. ......................... 327/94; 327/390; 327/384
(58) Field of Search ............................... 327/390, 391, 327/308, 389, 337, 374, 375, 94, 404, 384, 327/386

(56) References Cited

U.S. PATENT DOCUMENTS

| | | | | |
|---|---|---|---|---|
| 4,096,451 | A * | 6/1978 | Pradal | 331/116 R |
| 4,117,722 | A | 10/1978 | Helmstetter | 374/171 |
| 4,831,381 | A | 5/1989 | Hester | 341/172 |
| 4,975,700 | A | 12/1990 | Tan et al. | 341/118 |
| 5,159,341 | A | 10/1992 | McCartney et al. | 341/143 |
| 5,422,588 | A | 6/1995 | Wynne | 327/437 |
| 5,461,381 | A | 10/1995 | Seaberg | 341/143 |
| 5,500,612 | A | 3/1996 | Sauer | 327/91 |
| 5,675,334 | A | 10/1997 | McCartney | 341/118 |
| 5,691,720 | A | 11/1997 | Wang et al. | 341/143 |
| 5,870,048 | A | 2/1999 | Kuo et al. | 341/143 |
| 5,936,433 | A | 8/1999 | Holloway | 327/75 |
| 5,955,911 | A * | 9/1999 | Drost et al. | 327/404 |
| 5,982,315 | A | 11/1999 | Bazarjani et al. | 341/143 |
| 6,019,508 | A | 2/2000 | Lien | 374/178 |
| 6,037,887 | A | 3/2000 | Wu et al. | 341/143 |
| 6,052,000 | A * | 4/2000 | Nagaraj | 327/94 |
| 6,097,239 | A | 8/2000 | Miranda, Jr. et al. | 327/512 |
| 6,118,326 | A * | 9/2000 | Singer et al. | 327/390 |
| 6,147,550 | A | 11/2000 | Holloway | 327/544 |
| 6,160,393 | A | 12/2000 | Ahn et al. | 323/315 |
| 6,332,710 | B1 | 12/2001 | Aslan et al. | 374/183 |
| 6,609,419 | B1 * | 8/2003 | Bankart et al. | 73/146.5 |
| 6,674,185 | B2 | 1/2004 | Mizuta | 307/651 |

FOREIGN PATENT DOCUMENTS

| | | |
|---|---|---|
| GB | 2 031 193 A | 4/1980 |
| JP | 55000476 A | 1/1980 |

* cited by examiner

*Primary Examiner*—Tuan T. Lam
*Assistant Examiner*—Hiep Nguyen
(74) *Attorney, Agent, or Firm*—Carmen C. Cook; Patent Law Group LLP

(57) ABSTRACT

A low distortion, high frequency switch circuit for selectively coupling an input voltage terminal to an output voltage terminal includes a switching device coupled to the input voltage terminal and the output voltage terminal, a charge storage device, and a first, second and third switches. While the switch circuit is turned off, the charge storage device, typically a capacitor, is charged to a precharge voltage. Then, when the switch circuit is to be turned on, the charge storage device is coupled between the control terminal of the switching device and the input voltage terminal. As a result, the switching device receives a constant gate-to-source voltage approximately equals to the precharge voltage and becomes conductive with a minimum and constant $R_{ON}$ for all values of input voltages. In another embodiment, the switch circuit includes a pedestal voltage compensation circuit for reducing charge injection induced pedestal errors.

54 Claims, 10 Drawing Sheets

CONSTANT $R_{ON}$ SWITCH CIRCUIT WITH LOW DISTORTION AND REDUCTION OF PEDESTAL ERRORS

CROSS-REFERENCE TO RELATED APPLICATIONS

This application is related to the following concurrently filed and commonly assigned U.S. patent applications: U.S. patent application Ser. No. 10/402,658, entitled "Digitizing Temperature Measurement System," of Peter R. Holloway et al.; U.S. patent application Ser. No. 10/401,835, entitled "Low Noise Correlated Double Sampling Modulation System," of Peter R. Holloway et al., now U.S. Pat. No. 6,750,796, issued on Jun. 15, 2004; and U.S. patent application Ser. No. 10/402,447, entitled "Constant Temperature Coefficient Self-Regulating CMOS Current Source," of Peter R. Holloway et al. The aforementioned patent applications are incorporated herein by reference in their entireties.

FIELD OF THE INVENTION

The invention generally relates to a switch circuit. In particular, the present invention relates to a high frequency switch circuit having a constant "on" resistance and capable of operating at low power supply levels with little distortion and reduced pedestal errors.

DESCRIPTION OF THE RELATED ART

In a CMOS mixed-signal circuit, a CMOS transmission gate (T-gate) is typically used to implement the analog switching functions. The CMOS T-gate is preferred because it can operate with input voltage levels inclusive of ground and the power supply. FIG. 1 is a circuit diagram of a conventional CMOS T-gate circuit 100.

CMOS T-gate circuit 100 includes a T-gate 101 consisting of an NMOS transistor 104 and a PMOS transistor 106 connected in parallel. The source and drain nodes of transistors 104 and 106 are connected together to form switch input and output nodes 108 and 110, respectively. An input voltage Vin, provided by input voltage source 102, is applied across switch input node 108 and a ground node 112 (also called Vss). The output voltage Vout of T-gate 101 is provided at switch output node 110 relative to ground node 112.

Operation of T-gate 101 is well known in the art. In principle, the gate nodes of transistors 104 and 106 are driven with opposite logic levels, typically the power supply voltage Vdd and Vss, to control the on-off action of T-gate 101. Transistors 104 and 106 are either both on to turn T-gate 101 on or both off to turn T-gate 101 off. Acting as a switch, T-gate 101 transfers Vin from input voltage source 102 to switch output node 110 typically for charging a capacitive load $C_L$. For instance, capacitive load $C_L$ may be a track and hold capacitor for holding or acquiring a sample of Vin at a particular point in time.

Use of the conventional CMOS T-gates as the switching device has several disadvantages. One disadvantage is the lack of adequate drive voltages, or turn-on voltages, at low Vdd levels. Referring still to FIG. 1, if Vdd of CMOS T-gate circuit 100 is set at 2.0 volts and Vin is 1.0 volt, then the gate-to-source voltages Vgs for transistors 104 and 106 is only 1 volt and −1 volt respectively. For typical NMOS and PMOS transistors, the threshold voltages $V_T$ are 0.7 volts and −0.7 volts, respectively. Because only that portion of gate-to-source voltage Vgs in excess of threshold voltage $V_T$ can serve to turn transistors 104 and 106 on, transistors 104 and 106 are only turned on weakly. Alternatively, if Vdd is further lowered to below $2*V_T$ volts (e.g. 1.4 volts) and Vin is equal to $V_T$ (e.g. 0.7 volts), neither transistors 104 or 106 will turn on and T-gate 101 will be an open circuit. Thus, when T-gate 101 is operated at low Vdd levels, T-gate 101 has limited or no drive capability for certain values of Vin.

Even if there is sufficient drive capability, another disadvantage of conventional CMOS T-gates relates to the non-ideal behavior of the "on" resistance $R_{ON}$ of the CMOS T-gate. Referring to FIG. 1, $R_{ON}$ is the resistance between switch input and output nodes 108 and 110 when T-gate 101 is conducting, i.e. when transistors 104 and 106 are on.

The first non-ideal characteristic of $R_{ON}$ relates to the value of $R_{ON}$. Ideally, a switch should behave as a short circuit when it is turned on such that the "on" resistance is zero. However, for the conventional T-gates described above, the "on" resistance $R_{ON}$ has a finite (that is, non-zero) value which can be quite large. FIG. 2 is a graph of $R_{ON}$ versus Vin at various Vdd levels for a conventional CMOS T-gate. Curves 201 to 209 in FIG. 2 illustrate that a CMOS T-gate does not behave as a perfect short (i.e., $R_{ON}$ does not equal to zero) when the T-gate is on. Instead, $R_{ON}$ can be quite large, typically in the range of a few hundred to a few thousand ohms. A large $R_{ON}$ results in a large switch time constant $\tau_{ON}$ ($\tau_{ON}=C_L*R_{ON}$, where $C_L$ is the capacitive load of T-gate 100) which in turn results in a large attenuation of the input signal when passed through T-gate 101. Thus, the bandwidth of T-gate 101 is limited. Generally, the larger switch time constant $\tau_{ON}$ is, the longer it takes to get an accurate sample, i.e., the longer it takes to fully charge the capacitive load $C_L$. Therefore, it is desirable to provide a T-gate having a low $R_{ON}$.

One conventional method of reducing $R_{ON}$ is to increasing the width of the NMOS and PMOS transistors of the T-gate. However, increasing the size of the T-gate not only increases the fabrication cost, it also increases the parasitic capacitance $C_{par}$ of the T-gate to a great extent. As shown in FIG. 1, parasitic capacitance $C_{par}$ of T-gate 101 exists in parallel with capacitive load $C_L$ such that an increase in parasitic capacitance $C_{par}$ correspondingly increases switch time constant $\tau_{ON}$. (In this case $\tau_{ON}=(C_{par}+C_L)*R_{ON}$.) Accordingly, the width of the NMOS and PMOS transistors can only be increased to an optimum value beyond which the parasitic capacitance $C_{par}$ will dominate over $C_L$ and limits the bandwidth of the system, even though $R_{ON}$ is further reduced.

Another conventional method of reducing $R_{ON}$ is to reduce the threshold voltage of the NMOS and PMOS transistors of the T-gate. However, reducing the threshold voltage of the transistors in order to reduce $R_{ON}$ also has its limitation. At low Vdd voltages, such as 2.5 volts, the $V_T$ of the N-channel transistors would have to be decreased to a value below Vss to minimize $R_{ON}$. Similarly, the $V_T$ of the P-channel transistors would have to be increased to a value above Vss. Therefore, at low Vdd levels, the transistors become depletion mode devices and lose the ability to be completely turned off. Thus, neither of these prior art solutions are satisfactory at reducing $R_{ON}$.

The second non-ideal characteristic of $R_{ON}$ relates to the variation of $R_{ON}$ with respect to Vin. Ideally, the "on" resistance of a T-gate should be constant for all values of Vin. However, for the conventional T-gates described above, $R_{ON}$ varies with respect to Vin. Referring to FIG. 2, curves 201 to 209 show that $R_{ON}$ is not constant for all values of Vin. In fact, for any fixed Vdd, $R_{ON}$ increases to a higher value at some intermediate voltage value of Vin between 0V and Vdd. Furthermore, the amount of $R_{ON}$ variation increases as Vdd decreases. For example, at Vdd of 2.5 volts (curve 209), $R_{ON}$ becomes so large for Vin values between 1 to 2 volts that the T-gate is practically an open circuit (i.e. the T-gate is non-conductive).

When Vin is an AC or sinusoidal signal, this $R_{ON}$ variation causes distortion in the output signal. To illustrate, referring again to FIG. 1, if $R_{ON}$ was constant, output waveform at switch output node 110 would retain the shape and characteristics of the input waveform at switch input node 108, albeit reduced in magnitude. However, when $R_{ON}$ is a function of Vin, the switch time constant $\tau_{ON}$ ($\tau_{ON}=C_L*R_{ON}$) is also a function of Vin. Thus, the instantaneous attenuation of the input waveform at each particular point in time varies such that the output waveform at switch output node 110 is no longer a perfect replica of the input waveform at switch input node 108. Instead, the output waveform is distorted. This $R_{ON}$ variation places a fundamental limitation on the use of the conventional CMOS T-gates in high speed circuits, especially at low Vdd levels.

In summary, the two non-ideal characteristics of a conventional CMOS transmission gate limit its application as a switch in high performance CMOS mixed-signal circuits, particularly when the circuits are operating at very low Vdd (VLV) levels (i.e. Vdd voltages in the range of 2.0 to 3.0 volts). First, the finite and sometimes large "on" resistance of the T-gate limits the maximum bandwidth for a given load capacitance and a given fabrication process. The bandwidth limitation is even more problematic at low Vdd levels as $R_{ON}$ increases when Vdd decreases. Second, the variation in the "on" resistance leads to variation in bandwidth on an instantaneous basis, creating phase dispersion and harmonic distortion in the output waveform. Furthermore, the compound effect of a large $R_{ON}$ and $R_{ON}$ variation increases the total distortion of the switch circuit at a given frequency. Consequently, a switch circuit designed to work with a 5.0 volts Vdd will see an exponential increase in output distortion as Vdd is decreased. The resultant distortion represents a major barrier in the development of high performance, high speed circuits for operation at low Vdd levels.

Therefore, it is desirable to provide a switch circuit capable of operating at low Vdd levels with maximum bandwidth and minimum distortion. When a CMOS T-gate is used as the switch element, it is desirable to reduce the value of $R_{ON}$ by a factor of 2 to 5. However, $R_{ON}$ should be reduced without the corresponding increase in $C_{par}$, and vice versa. Furthermore, it is desirable to minimize the variation of $R_{ON}$ over the full range of input voltages.

SUMMARY OF THE INVENTION

According to one embodiment of the present invention, a switch circuit for selectively coupling an input terminal to an output terminal includes a switching device, a charge storage device, a first switch, a second switch and a third switch. The switch circuit of the present invention is suitable for use in high frequency or low power supply voltage applications and is capable of eliminating harmonic distortions of the output signals, even for very low Vdd applications.

The switching device of the switch circuit is coupled between the input terminal and the output terminal and has a control terminal. The charge storage device, typically a capacitor, has a first terminal and a second terminal. The first switch is coupled to the control terminal of the switching device and has a first position coupled to a first supply voltage and a second position being an open circuit. The second switch is coupled to the first terminal of the charge storage device and has a first position coupled to a second supply voltage and a second position coupled to the control terminal of the switching device. The third switch is coupled to the second terminal of the charge storage device and has a first position coupled to the first supply voltage and a second position coupled to the input terminal.

When the first, second and third switches are in the first positions, the switch circuit is turned off. When the first, second and third switches are in the second positions, the switch circuit is turned on. In one embodiment, the first, second and third switches are in the first positions in response to a first clock signal and are in the second positions in response to a second clock signal. Furthermore, in another embodiment, the first and second clock signals are non-overlapping clock signals.

When the switch circuit is to be turned off, the control terminal of the switching device is coupled to the first supply voltage, typically at ground, causing the switching device to be nonconductive. At the same time, the capacitor is coupled between the first supply voltage and the second supply voltage, typically the power supply voltage Vdd, such that the capacitor is precharged to the power supply voltage Vdd.

Then, when the switch circuit is to be turned on, the control terminal of the switching device is disconnected from the first supply voltage and the capacitor is coupled between the control terminal of the switching device and the input terminal. As a result, the switching device receives a constant gate-to-source voltage approximately equals to the power supply voltage Vdd and becomes conductive.

In the case where the switching device is an NMOS transistor and the second supply voltage is the power supply voltage Vdd, the gate-to-source voltage approximately equals the supply voltage Vdd allowing realization of a minimum "on" resistance $R_{ON}$ for all values of input voltages. This reduction in $R_{ON}$ improves the bandwidth of operation by reducing the switch time constant $\tau_{ON}$ (where $\tau_{ON}=C_L*R_{ON}$).

Secondly, not only is $R_{ON}$ reduced to a minimum, the $R_{ON}$ variation over the range of input voltages is also reduced or eliminated. In particular, the capacitor acts as a floating battery transferring any changes in the input voltage at the input terminal to the gate terminal of the switching device resulting in a constant gate-to-source voltage for all values of input voltage. Since $R_{ON}$ is a function of the gate-to-source voltage, which is a constant, $R_{ON}$ also becomes independent of the input voltage and is constant across the full range of input voltages. Accordingly, the ratio of the maximum $R_{ON}$ to the minimum $R_{ON}$ is unity. In contrast, conventional T-gates have a ratio of $R_{ON}$ variations from 1.5 to 4 or more. By eliminating $R_{ON}$ variations, distortion of the input signal is avoided.

Thus, the switch circuit in accordance with the present invention provides a minimum $R_{ON}$ while at the same time eliminates $R_{ON}$ variations of the prior art. Accordingly, the switch circuit is well suited for use in high performance, high speed circuits which operate at low Vdd levels.

Also in accordance with the present invention, a method of selectively coupling an input voltage terminal to an output voltage terminal includes providing a switching device coupled between the input voltage terminal and the output voltage terminal, precharging a charge storage device, typically a capacitor, to a precharge voltage, coupling the capacitor between the input voltage terminal and the control terminal of the switching device, causing the switching device to be turned on. The method further includes the steps of disconnecting the capacitor from the input terminal and the control terminal of the switching device and connecting the gate terminal of the switching device to ground, turning off the switching device.

According to another aspect of the present invention, a pedestal voltage compensation circuit is provided in a first circuit for compensating pedestal error voltages caused by charge injection into a sensitive terminal of a circuit. The pedestal voltage compensation circuit has application in any switch circuits and, in particular, in the switch circuit of the present invention for eliminating pedestal errors at the output terminal of the switch circuit.

In one embodiment, the pedestal voltage compensation circuit for compensating charge injection at a first node of a first circuit includes a switch coupled to a second node of the first circuit. The second node provides a first charge which is the complement of a source charge causing the charge injection at the first node. The compensation circuit further includes a capacitor divider coupled to the first node and a third node where the third node is a low impedance node. In operation, the switch directs the first charge to the common node of the capacitor divider. The capacitor divider divides the first charge to generate a compensating charge. The capacitor divider provides the compensating charge to the first node for canceling the injected charge.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

Figure 3:
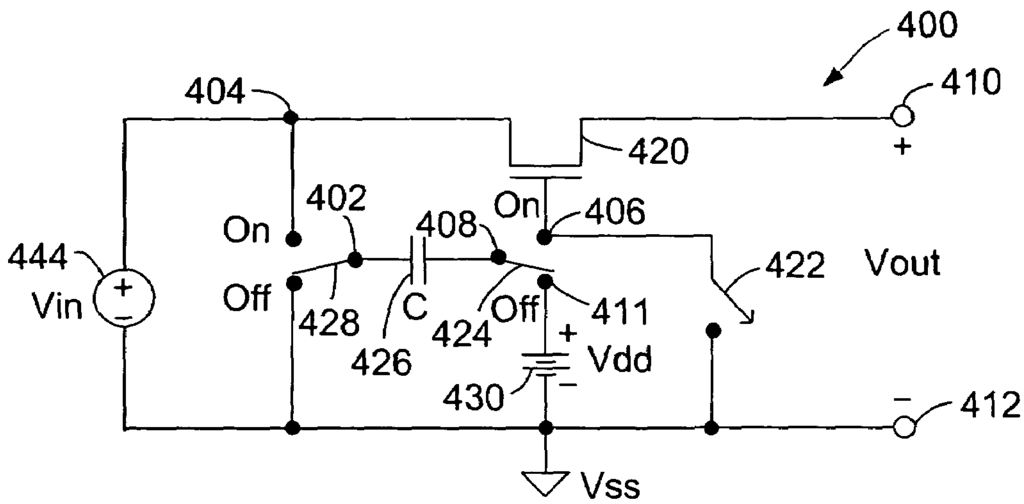
FIG. 3 is a circuit diagram of a self-bootstrapping constant $R_{ON}$ switch circuit in accordance with one embodiment of the present invention.

In accordance with the principles of the present invention, a self-bootstrapping constant $R_{ON}$ switch circuit is provided. The switch circuit is capable of operating at Vdd levels as low as 2.0 volts with negligible distortion of the output waveform. FIG. 3 is a circuit diagram of a self-bootstrapping constant $R_{ON}$ switch circuit 400 in accordance with one embodiment of the present invention. Referring to FIG. 3, switch circuit 400 includes an NMOS transistor 420 functioning as the main switching device. NMOS transistor 420 is an enhancement mode device having a threshold voltage value of less than 1 volt (typically 0.7 volts). The output voltage Vout of NMOS transistor 420 is provided at a node 410 with respect to ground node 412 (also called Vss). Output voltage Vout typically drives other circuitry such as a capacitive load $C_L$ (not shown).

Switch circuit 400 includes switches 422, 424 and 428, and a capacitor 426. Switches 422, 424 and 428 together with capacitor 426 operate to boost the gate-to-source voltage Vgs of NMOS transistor 420 (i.e. voltage between nodes 406 and 404). In switch circuit 400, capacitor 426 can be implemented as an MOS capacitor or as other charge storage devices well known in semiconductor fabrication processes.

Switch circuit 400 further includes an input voltage source 444 which provides a voltage Vin at node 404. Generally, Vin varies between Vss and a voltage up to a power supply voltage Vdd. In FIG. 3, a precharge voltage source 430 is shown as providing a voltage equaling the power supply voltage Vdd to node 411. In the present embodiment, precharge voltage source 430 is illustrative only and in an actual implementation of switch circuit 400, node 411 can simply be connected to the power supply (or Vdd) terminal of switch circuit 400. However, in other embodiments, precharge voltage source 430 can provide a voltage other than the Vdd voltage. The benefits of using a voltage other than the Vdd voltage for precharge voltage source 430 will be explained in more detail below.

Figure 4:
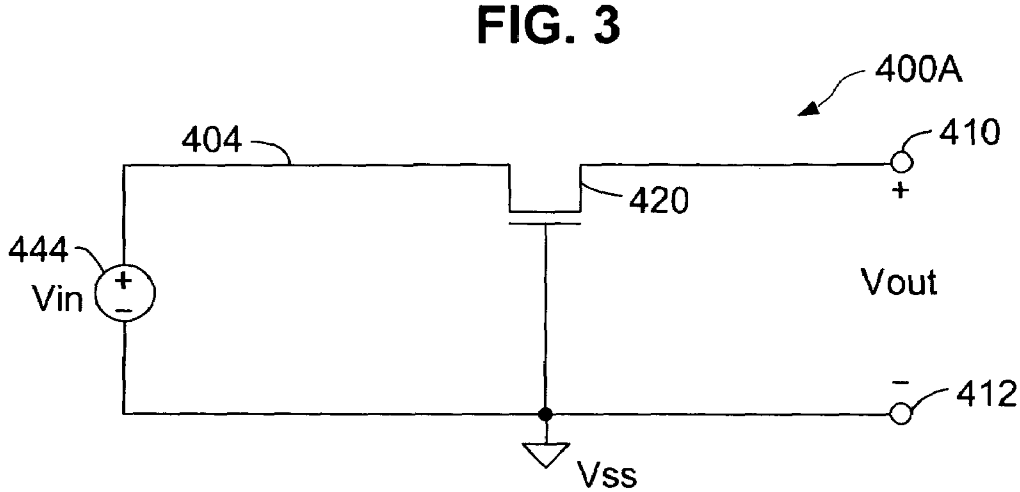
FIGS. 4 and 5 are equivalent circuits of the switch circuit of FIG. 3 operating in the "off" state and in the "on" state respectively.
Figure 5:
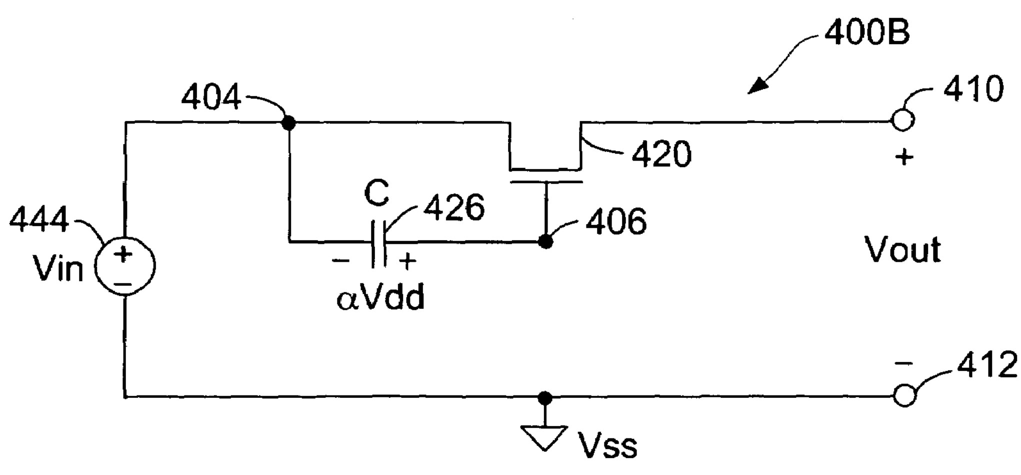

The operation of switch circuit 400 is described with reference to FIGS. 4 and 5. FIGS. 4 and 5 are equivalent circuits of switch circuit 400 of FIG. 3 operating in the "off" state and in the "on" state respectively. Referring to FIG. 4, when switch circuit 400 is to be turned off, the gate of NMOS transistor 420 is connected to ground node 412. Since NMOS transistor 420 is an enhancement mode device, NMOS transistor 420 is completely turned off when its gate is grounded. Consequently, no current flow between the source and drain terminals (nodes 404 and 410) of NMOS transistor 420. While switch circuit 400 is turned off, capacitor 426 is precharged to a voltage level equal to Vdd (FIG. 3).

When switch circuit 400 is to be turned on, a self-bootstrap technique is employed to bias the gate of NMOS transistor 420. Specifically, capacitor 426, precharged to a value of Vdd, acts as a floating battery for providing a desirable gate-to-source voltage Vgs to the gate of NMOS transistor 420. Referring to FIG. 5, when switch circuit 400 is turned on, capacitor 426 is coupled between the gate terminal (node 406) and the source terminal (node 404) of NMOS transistor 420. In this configuration, NMOS transistor 420 receives a constant gate-to-source voltage Vgs equaling αVdd for all values of Vin, where α is approximately equal to one.

In particular, when input voltage source 444 applies Vin at node 404, capacitor 426, acting as a floating battery, transfers any changes in Vin at node 404 to node 406. Thus, under the conditions illustrated in FIG. 5, even though Vin may vary, gate-to-source voltage Vgs of NMOS transistor 420 is constant. Because gate-to-source voltage Vgs of NMOS transistor 420 is not a function of Vin, $R_{ON}$ of NMOS transistor 420 (which is a function of gate-to-source voltage Vgs) also becomes independent of Vin and is constant across the full range of input voltages.

The various circuit elements in switch circuit 400 are provided to obtain the operating conditions illustrated in FIGS. 4 and 5. Referring to FIG. 3, to turn switch circuit 400 off, switch 422 is closed, i.e., switch 422 is in the "off" position. When switch 422 is closed, node 406, the gate of NMOS transistor 420, is connected to ground node 412 through switch 422 and NMOS transistor 420 is turned off. Meanwhile, capacitor 426 is being precharged through switches 424 and 428. When switches 424 and 428 are in their respective "off" positions, switch 428 connects the left side of capacitor 426 (node 402) to ground node 412 and switch 424 connects the right side of capacitor 426 (node 408) to node 411 which is at Vdd. Thus, while switch circuit 400 is turned off, capacitor 426 is precharged to a voltage value of Vdd.

When switch circuit 400 is turned on, switches 422, 424 and 428 switch to their respective "on" positions. Switch 422 is opened so that the gate of NMOS transistor 420 (node 406) is no longer coupled to ground node 412. Instead, switch 424 is toggled up to connect node 408 (the right side of capacitor 426) to node 406 (the gate of NMOS transistor 420). Switch 428 also swings up to connect node 402 (the left side of capacitor 426) to node 404 (the source terminal of NMOS transistor 420). When thus switched, switch circuit 400 is configured as in FIG. 5 and the voltage Δvdd across capacitor 426 is impressed across the gate (node 406) and source (node 404) terminals of NMOS transistor 420.

Even though capacitor 426 is precharged to a voltage Vdd, a certain amount of voltage is lost during the switching action such that after switches 424 and 428 reach the "on" positions, the voltage across capacitor 426 is αVdd where α is less than but very close to unity. The amount of voltage loss during the transition of the switches is a function of the capacitance of capacitor 426. In the present embodiment, the capacitance of capacitor 426 can have a value between 50 femto-Farad to 5 pico-Farad. When capacitor 426 has a moderately large capacitance value, such as around 5 pF, only a negligible amount of voltage will be lost in the transfer and α is essentially unity. When capacitor 426 has a very small capacitance value, such as around 50 fF, then the amount of voltage loss will be greater and α can be as low as 0.8 or 0.9. The value of α is critical only to the extent that capacitor 426 has maintained enough voltage to turn NMOS transistor 420 on.

Figure 1:
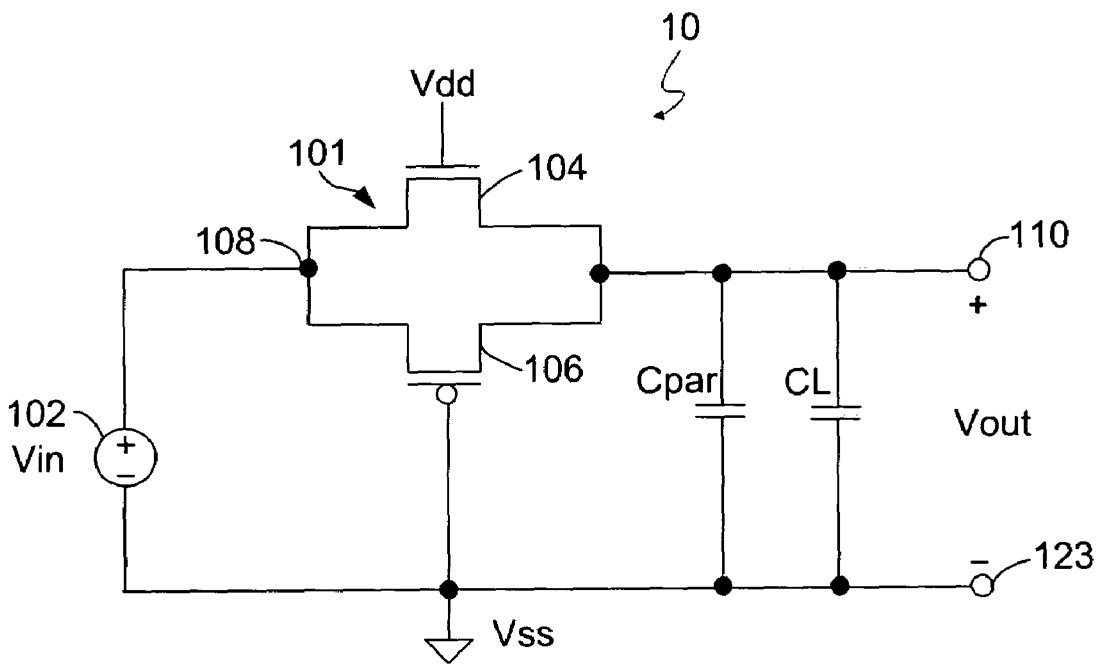
FIG. 1 is a circuit diagram of a conventional CMOS T-gate circuit.
Figure 2:
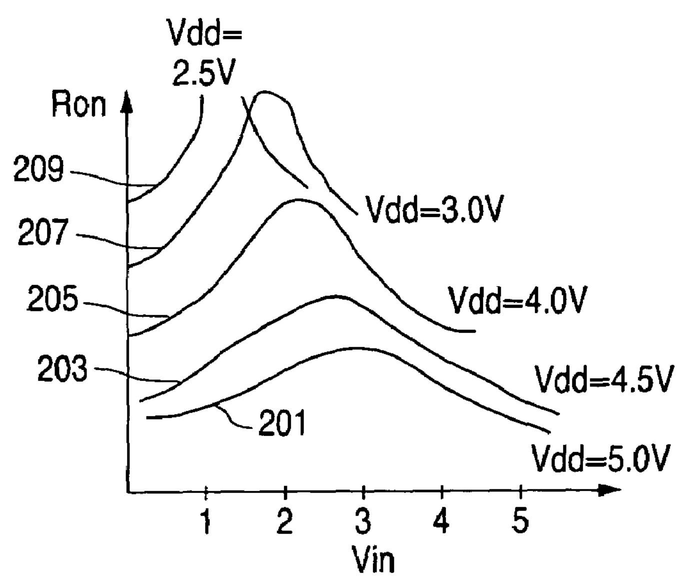
FIG. 2 is a graph of $R_{ON}$ versus Vin at various Vdd levels for a conventional CMOS T-gate.

Switch circuit 400 operating under the conditions in FIG. 5 achieves significant improvements over the prior art. First, in accordance with the present invention, a minimum $R_{ON}$ is achieved for all values of Vin. Referring again to FIG. 2, in the prior art, $R_{ON}$ is at its minimum when Vin is either at 0 volt or equals Vdd. In the conventional T-gate, Vgs=Vdd−Vin. Therefore, $R_{ON}$ is at its minimum when Vgs is either 0 volt or Vdd. In switch circuit 400 of FIG. 3, gate-to-source voltage Vgs of NMOS transistor 420 is αVdd where a approaches unity. Thus, gate-to-source voltage Vgs of NMOS transistor 420 approaches Vdd for all values of Vin, and NMOS transistor 420 is biased at an optimal value where $R_{ON}$ is minimum for all values of Vin. This reduction in $R_{ON}$ improves the bandwidth of operation by reducing the switch time constant $\tau_{ON}$ (where $\tau_{ON}=C_L*R_{ON}$).

Second, not only is $R_{ON}$ reduced to a minimum, the $R_{ON}$ variation over the range of input voltages is also reduced or eliminated. As discussed above, in switch circuit 400 of FIG. 3, the gate-to-source voltage Vgs of NMOS transistor 420 is αVdd for all values of Vin, where α approaches unity. Thus, gate-to-source voltage Vgs of NMOS transistor 420 is a constant value. Since $R_{ON}$ is a function of gate-to-source voltage Vgs, which is a constant, $R_{ON}$ is also constant for all values of Vin. Accordingly, β is unity, where β is defined as the ratio of the maximum $R_{ON}$ to the minimum $R_{ON}$. In contrast, referring to FIG. 2, conventional T-gates have β variations from 1.5 to 4 or more. By eliminating $R_{ON}$ variations, distortion of the input signal is avoided.

Thus, switch circuit 400 in accordance with the present invention provides a minimum $R_{ON}$ while at the same time eliminates $R_{ON}$ variations over input voltages. Accordingly, switch circuit 400 is well suited for use in high performance, high speed circuits which operate at low Vdd levels.

In an alternative embodiment, instead of connecting node 411 to the Vdd terminal, precharge voltage source 430 (FIG. 3) can be implemented as a conventional charge pump which generates an output voltage at node 411 greater than Vdd. In accordance with this embodiment, the gate-to-source voltage Vgs on NMOS transistor 420 will exceed Vdd, further enhancing the performance of switch circuit 400.

Figure 16:
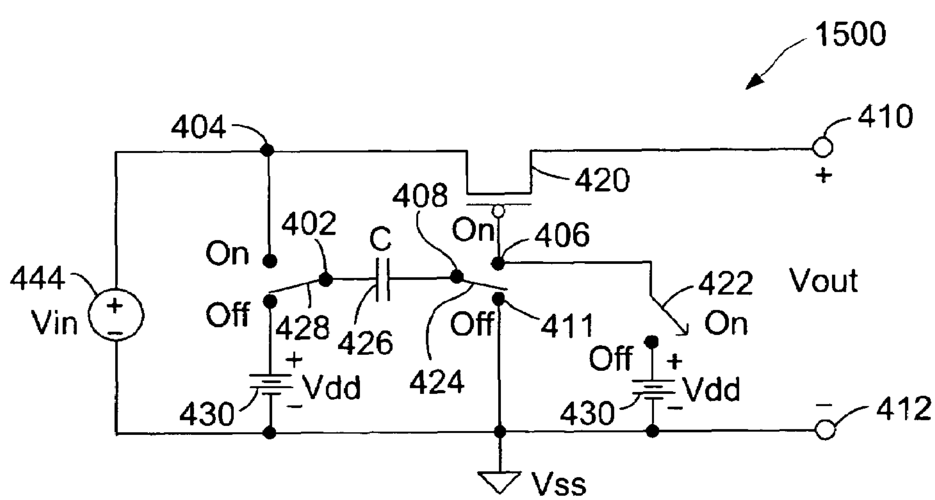
FIG. 16 is a circuit diagram of the self-bootstrapping constant $R_{ON}$ switch circuit implemented using a PMOS transistor as the switching device according to one embodiment of the present invention.

In FIG. 3, switch circuit 400 uses a single NMOS transistor as the main switching device. The use of a single NMOS transistor as the switching device in the present embodiment is illustrative only and is not intended to be limiting. The switch circuit of the present invention can be implemented using other switching devices well known by those skilled in the art. In other embodiments of the present invention, a single PMOS transistor can be used as the main switching device. Alternately, a CMOS transmission gate including a NMOS transistor and a PMOS transistor connected in parallel can be used as the main switching device. When a PMOS transistor is used alone or in conjunction with a NMOS transistor as the main switching device, the voltage polarities of switch circuit 400 of FIG. 3 are adjusted accordingly to provide the appropriate control voltages for controlling the PMOS transistor, as is well understood by one of ordinary skill in the art. FIG. 16 is a circuit diagram of the self-bootstrapping constant $R_{ON}$ switch circuit implemented using a PMOS transistor as the switching device according to one embodiment of the present invention. Like elements in FIGS. 3 and 16 are given like reference numerals. As shown in FIG. 16, in the case where a PMOS transistor 1520 is used as the main switching device, the gate terminal is connected to the Vdd voltage for turning off the transistor. Capacitor 426 is precharged so as to apply a −Vdd voltage across the gate and source terminals of PMOS transistor 1520 for turning the transistor on. Of course, in the case where a CMOS transmission gate is used as the switching device, the switch circuit of the present invention includes switch circuit 400 for driving the NMOS switching transistor 420 and a complementary switch circuit for driving the PMOS switching transistor.

However, the use of a single NMOS transistor as the switching device in the switch circuit of the present invention provides particular advantages over the use of other switching devices, especially in applications where a reduced Vin range is used.

For the purpose of this description, a reduced Vin range refers to the condition when Vin values are only a small fraction of the Vdd voltages. For example, an application is operating in a reduced Vin range when Vin varies between 0 and 1 volt and Vdd is 2 volts or more. In an application operating in a reduced Vin range, using a single NMOS transistor as the switching device is preferred as long as enough gate drive is provided to turn on the NMOS transistor. NMOS devices are preferred over PMOS devices because NMOS devices have a higher carrier mobility than that of PMOS devices. In particular, carrier mobility for an NMOS device is typically in the order of 500 $cm^2V^{-1}S^{-1}$ which is approximately twice as much as that for a PMOS device. Further, NMOS devices typically have a lower $R_{ON}$ for a given value of gate voltages because of the higher carrier mobility.

To offset the disparity of carrier mobility between NMOS and PMOS devices, CMOS transmission gates typically employ PMOS transistors having twice the size of NMOS transistors and, in particular, the PMOS transistor is typically sized 2.5 times larger than the NMOS transistor. Increasing the size of the PMOS transistor correspondingly increases the amount of parasitic capacitance $C_{par}$ of the switch circuit. However, in the present embodiment, the switch circuit employs only an NMOS transistor. The elimination of the PMOS transistor in the switch circuit of the present invention results in at least a three times reduction in parasitic capacitance $C_{par}$ as compared to the conventional implementation using a CMOS transmission gate. Thus, through the use of a single NMOS transistor (transistor 420) as the switching device and capacitor 426 for self-bootstrapping, switch circuit 400 can achieve three to five times improvement in the switch time constant $\tau_{ON}$ because both $R_{ON}$ and parasitic capacitance $C_{par}$ are substantially reduced. As a result, a substantial improvement in the bandwidth of operation is achieved for switch circuit 400.

Implementation of the switching action in switch circuit 400 requires overcoming obstacles arising from the voltages involved in the circuit. Referring to FIG. 3, Vin voltage at node 404 can vary between 0V and Vdd. Thus, switch 428 can be implemented using conventional switches because switch 428 only needs to function at conventional voltage levels between 0V and Vdd.

The situation is different for switches 422 and 424 because these switches have to support voltages greater than Vdd while being controlled by logic levels that are limited to Vdd. Specifically, node 406 (the gate of NMOS transistor 420) can see a voltage swing from 0 volt to 2 times Vdd (or 2Vdd). Node 406 is at 0V when switch circuit 400 is off and node 406 is at Vin+αVdd when switch circuit 400 is on. Thus, when Vin is at its maximum (i.e. Vdd), node 406 reaches a value of 2Vdd (assuming that a approaches unity).

Similarly, at the right side of capacitor 426, node 408 varies between Vdd and 2Vdd. Node 408 is at Vdd when capacitor 426 is being precharged by precharge voltage source 430. When capacitor 426 is applied to the gate of NMOS transistor 420, node 408 is electrically connected to node 406 and the voltage value becomes Vin+αVdd, where at its maximum equals 2Vdd. For example, when Vdd is 2.5 volts, Vin at node 404 can vary between 0 and 2.5 volts. Capacitor 426 is precharged to 2.5 volts. Node 406 (the gate of NMOS transistor 420) will vary between 0 and 5 volts. Meanwhile, node 408 will vary between 2.5 and 5 volts. Thus, switch 424 must be capable of supporting voltages between Vdd and 2Vdd while switch 422 must be capable of supporting voltages between 0 and 2Vdd. The voltage levels involved in switch circuit 400 necessitates careful use of isolation wells, control drive switching techniques, and parasitic management as discussed in greater detail below in conjunction with FIG. 6.

Figure 6:
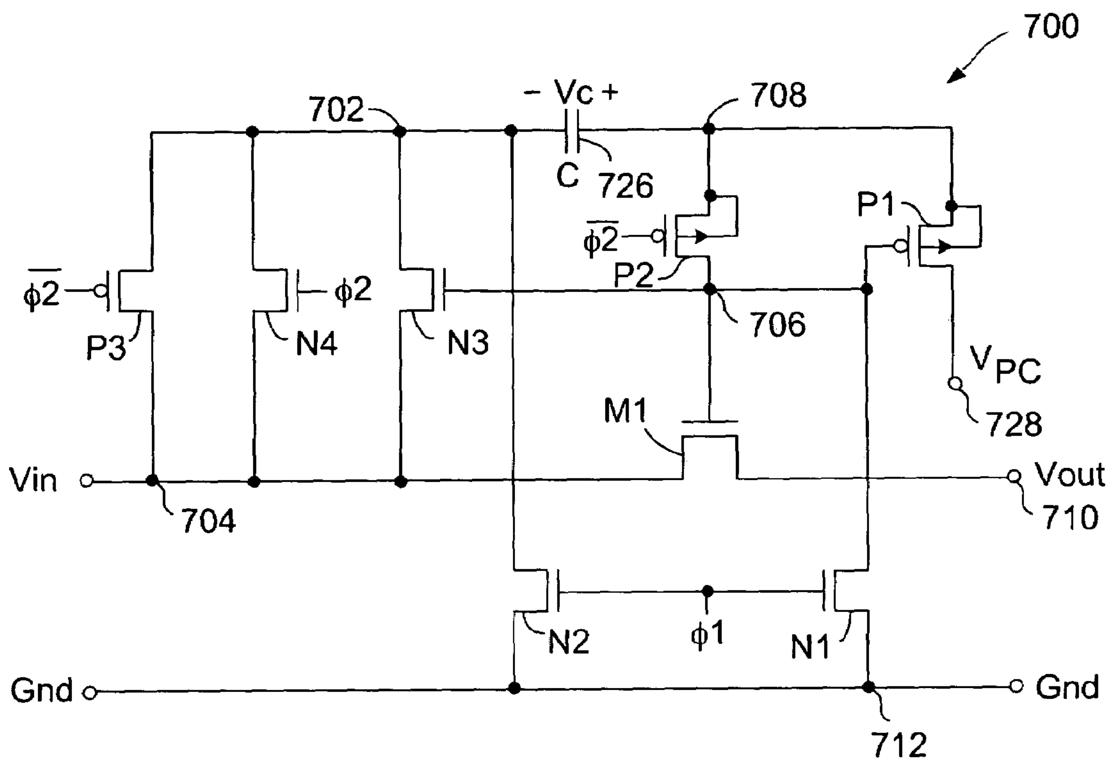
FIG. 6 is a transistor level circuit diagram of the switch circuit of FIG. 3 in accordance with one embodiment of the present invention.

FIG. 6 is a transistor level circuit diagram of switch circuit 400 of FIG. 3 in accordance with one embodiment of the present invention. In the description that follows, reference numerals beginning with the letter "N" denote NMOS transistors and reference numerals beginning with the letter "P" denote PMOS transistors and it is assumed that αis unity. Switch circuit 700 operates under the timing control of clocks φ1 and φ2 illustrated in FIG. 7.

In FIG. 6, NMOS transistor M1 is the main switching device in switch circuit 700 (also referred to as the switching transistor). Thus, transistor M1 implements the functions of NMOS transistor 420 in FIG. 3. When the gate terminal (node 706) of transistor M1 is properly biased, transistor M1 acts as a pass transistor connecting voltage Vin at node 704 to voltage Vout at node 710.

Transistor N1 of FIG. 6 implements the function of switch 422 of FIG. 3. Transistor N1 is connected between node 706 and ground node 712 and is driven by clock φ1. When switch circuit 700 is turned off, clock φ1 is at a high logic level and transistor N1 is turned on to ground the gate node of transistor M1 (node 706). When clock φ1 goes to a low logic level in the "on" state of switch circuit 700, transistor N1 is turned off and node 706 is no longer connected to ground node 712.

Transistors N2, N3, N4 and P3 of FIG. 6 implement the function of switch 428 of FIG. 3. Transistors N4 and P3 are configured as a conventional CMOS transmission gate. Specifically, transistors N4 and P3 are connected in parallel between node 704 (Vin) and node 702 (left side of capacitor 726), and driven with opposite clock signals, φ2 and φ2(inv) respectively. Transistors N4 and P3 implement the "on" position of switch 428 (FIG. 3). The "off" position of switch 428 is implemented by transistor N2. Transistor N2 has a drain node connected to node 702, a source node connected to ground node 712 and a gate terminal driven by clock φ1.

In FIG. 6, a transistor N3, connected in parallel with transistors N4 and P3, is included to assist in connecting node 702 to node 704 (i.e. connecting the left side of capacitor 726 to Vin). The gate of transistor N3 is connected to node 706 and to the gate of transistor M1. As previously described, node 706 is at 0 volt when switch circuit 700 is turned off and thus transistor N3 is also turned off. But when switch circuit 700 is turned on, node 706 equals Vin+Vdd. Thus, transistor N3 is turned on to provide another conduction path between node 702 and node 704 when switch circuit 700 is turned on. Because node 706 can reach a voltage value of 2Vdd, transistor N3 can pass a Vin voltage equaling Vdd without degradation. In the present embodiments, transistors N3, N4, and P3 all work to provide a conduction path between nodes 702 and 704 when switch circuit 700 is turned on. In other embodiments, one or more of transistors N3, N4, and P3 can be omitted. One skilled in the art will appreciate that one or a combination of transistors N3, N4, and P3 can be used to implement the "on" function of switch 428 and that appropriate transistors sizes can be selected to achieve the desired ohmic connection between nodes 702 and 704.

Referring still to FIG. 6, transistors P1 and P2 implement the function of switch 424 of FIG. 3. In particular, transistor P1 implements the "off" function of switch 424. Transistor P1 is connected between a precharge voltage Vpc node 728 and node 708 (the right side of capacitor 726). The gate of transistor P1 is driven by node 706. In the present embodiment, precharge voltage Vpc at node 728 is held at the power supply voltage Vdd. However, other embodiments, the precharge voltage Vpc can be held at voltages other than the power supply voltage Vdd as will be explained in more details below. When switch circuit 700 is turned off, node 706 is grounded through transistor N1 and transistor P1 is turned on to connect node 708 to Vpc node 728 for precharging capacitor 726 to a value of Vdd. When switch circuit 700 is turned on, node 706 goes to a value between Vdd and 2Vdd and transistor P1 is turned off, disconnecting the right side of capacitor 726 from Vdd (node 728).

Working in conjunction with transistor P1 is transistor P2 which implements the "on" function of switch 424. Transistor P2 is responsible for connecting the right side of capacitor 726 (node 708) to the gate of transistor M1 (node 706) when switch circuit 700 is turned on. In operation, transistor P2 together with transistors N3, N4, and P3 operate to connect capacitor 726 across the gate and source terminals of transistor M1. In FIG. 6, transistor P2, connected between node 706 and node 708, is driven by clock φ2(inv). When switch circuit 700 is turned off, clock φ2(inv) is at a high logic level and transistor P2 is turned off. When switch circuit 700 is turned on, clock φ2(inv) is at a low logic level and transistor P2 is turned on providing a conduction path between node 706 and node 708.

Figure 7:
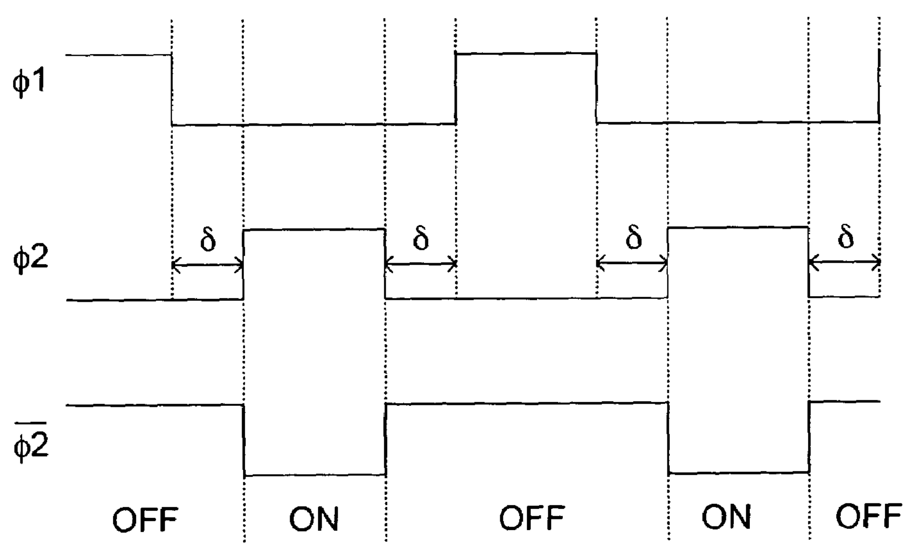
FIG. 7 is a timing diagram illustrating the operation of the switch circuit of FIG. 6.

As set forth above, switch circuit 700 operates under the timing control of clocks φ1, φ2, and φ2(inv). FIG. 7 is a timing diagram illustrating the operation of switch circuit 700 in accordance with the present invention. In the present embodiment, clocks φ1, φ2, and φ2(inv) implement a non-overlapping clocking scheme. To turn switch circuit 700 on, clock φ1 is low while φ2 is high after a delay of time δ. φ2(inv), being the inverse of φ2, goes low after the delay of δ. When switch circuit 700 is to be turned off, the clocks switch to their respective opposite states: φ2 goes low (φ2(inv) goes high) and φ1 goes high after a delay of time δ.

In the present invention, the δ delay time between the edges of clocks φ1 and φ2 is provided to implement the non-overlapping clocking scheme. The δ delay between clock φ2 falling edge and clock φ1 rising edge is introduced to ensure that transistors N1 and N2 and P1 are not conducting until well after all the transistors that are on and conducting during the time that clock φ2 is high have fully turned off. The delay time introduced avoids undesirable parasitic conduction paths from occurring, such as would be the case if transistors N2 and P3 and N4 were simultaneously on, shorting Vin (node 704) to ground (node 712), or would also be the case if transistors P1 and P3 and N4 were simultaneously on, shorting voltage Vpc (node 728) to high voltage node 708, which would have the undesirable effect of lowering the voltage at node 708 from its fully on voltage value of Vin+αVpc to Vpc, causing the gate to source voltage of transistor M1 to be decreased from the amount of αVpc to (Vpc-Vin). This voltage reduction in gate drive to transistor M1 would either turn transistor M1 completely off or substantially off (high impedance state) when transistor M1 should be fully on.

On the other hand, the δ delay between clock φ1 falling edge and clock φ2 rising edge is introduced to ensure that transistors P3, N4, N3 and N2 are all off, leaving node 702 in a high impedance state. At the same time, transistor P2 remains off, thus allowing high voltage node 708 to remain at voltage Vpc while node 706 remains at or near ground, keeping transistor M1 off and also preventing an undesirable parasitic conduction path from occurring as would be the case if transistors N1 and P2 were simultaneously on, shorting high voltage node 708 to ground (node 712). The non-overlapping clocking scheme shown in FIG. 7 avoids all undesirable parasitic conduction paths from occurring. Thus, switch circuit 700 is able to operate with a very precise and well-defined aperture for turning the switching transistor M1 on and off to pass the input voltage Vin at input node 704 to the output voltage Vout at output node 710.

In the timing scheme illustrated in FIG. 7, the delay times at both edges of clock φ2 are the same. However, the delay time between clock φ2 falling edge and clock φ1 rising edge and the delay time between clock φ1 falling edge and clock φ2 rising edge can be different and varied. The timing diagram of FIG. 7 is illustrative only and one of ordinary skill in the art would appreciate that the different delay times can be used to operate the switch circuit of the present invention.

In an alternate embodiment of switch circuit 700, transistors P3 and N4 can be eliminated and only transistor N3 is used for connecting node 702 to node 704. When the modified switch circuit is to be turned off, no delay between the falling edge of clock φ2 and the rising edge of clock φ1 is needed because transistors N1 and N2 can be immediately engaged to turn off transistor M1. Thus, the falling edge of clock φ2 can coincide with the rising edge of clock φ1.

The alternate embodiment of switch circuit 700 described above can be further modified so that the switch circuit is operated with only one clock (clock φ1) for turning on and off the switch circuit. Specifically, as described above, transistors P3 and N4 can be eliminated and only transistor N3 is used for connecting node 702 to node 704. To eliminate the use of clock φ2, the gate terminal of transistor P2 is controlled by clock φ1, instead of clock φ2(inv). To turn the switch circuit on, clock φ1 is low. When the switch circuit is to be turned off, clock φ1 switches to its opposite state of being high. One of ordinary skill in the art would appreciate that by carefully choosing the sizes of transistors P1 and N3, when clock φ1 goes low, transistor P1 can be turned off entirely before transistor N3 is turned on. One of ordinary skill in the art would also appreciate that by carefully choosing the sizes of transistors N1 and P2, when clock φ1 goes low, transistor N1 can be turned off entirely before transistor P2 is turned on.

In the present invention, transistor P1 is driven by node 706 which has a value above Vdd when switch circuit 700 is on. Node 706 is used to drive transistor P1 in order to ensure that transistor P1 is turned off for all values of source voltages that appear at node 708. In particular, when switch circuit 700 is in the "on" state, the source of transistor P1 (node 708) can vary between Vdd and 2Vdd. If the gate voltage of transistor P1 was driven by conventional logic levels limited to Vdd, then transistor P1 would actually get turned on when node 708 rises to a threshold voltage value above Vdd. The present invention solves this problem by driving the gate of transistor P1 with high voltage node 706 to ensure that the gate-to-source voltage Vgs of transistor P1 will never exceed the threshold voltage $V_T$ so that transistor P1 will not get turned on when switch circuit 700 is on.

Although the source and drain terminals (nodes 708 and 706) of transistor P2 can reach 2Vdd when switch circuit 700 is on, the gate terminal of transistor P2 can be driven by clock φ2 (inv) having a voltage swing between 0V and Vdd.

In particular, when switch circuit 700 is on, ϕ2 (inv) is at a low state (e.g. ground). The gate-to-source voltage Vgs of transistor P2 is in the range of −Vdd to −2Vdd which exceeds the threshold voltage $V_T$ of transistor P2, thus keeping transistor P2 on. When switch circuit 700 is off, ϕ2 (inv) drives the gate of transistor P2 to a high state (e.g. Vdd). The source and drain terminals (nodes 708 and 706) are at Vdd and at ground, respectively. Therefore, the gate-to-source voltage Vgs is greater than 0 volt which is more positive than the threshold voltage $V_T$ of transistor P2, thus keeping transistor P2 off. Therefore, switch circuit 700 can be operated with conventional logic circuitry (clocks ϕ1, ϕ2, ϕ2(inv)) having voltage swings between ground and Vdd.

Transistors P1 and P2, being devices for handling voltages beyond the power supply voltage Vdd, are placed in an N well which must be properly biased to avoid junction breakdown between the source and drain terminals of these transistors and the N well. In the present embodiment, transistors P1 and P2 are placed within a single N well. According to the present invention, the N well in which transistors P1 and P2 are situated is bootstrapped to allow the well bias voltage to rise to a value up to 2Vdd. In the present embodiment, the N well of transistors P1 and P2 is connected to node 708, instead of Vdd as is conventionally done. As described above, when switch circuit 700 is turned on and node 708 is connected to node 706, node 708 varies between Vdd to 2Vdd. The N well bias voltage will rise accordingly to a value between Vdd and 2Vdd. Therefore, the junction between the source and drain terminals of transistors P1 and P2 and the N well will not become forward-biased under any circumstances. In an alternate embodiment, transistors P1 and P2 can be placed in separate N wells and each N well can be individually connected to node 708.

In switch circuit 700, PMOS transistors P1 and P2 are used to handle the high voltage nodes 706 and 708. As described above, node 706 can vary between 0 volt and 2Vdd while node 708 can vary between Vdd and 2Vdd. Generally, in a conventional fabrication process, PMOS transistors are more suitable than NMOS transistors for handling high voltage conditions at its gate and source/drain terminals. This is because PMOS devices are built in N wells having higher concentration than the P wells or the P-substrate in which the NMOS devices are built. Also, the N wells are isolated from the substrate, eliminating possible substrate emission problems. In accordance with the present invention, the N wells of the PMOS devices P1 and P2 are bootstrapped to prevent the source-drain junctions from being forward-biased. Therefore, PMOS devices P1 and P2 are made more robust so as to handle voltages up to two times the power supply voltage.

Semiconductor fabrication processes can be classified by the supply voltage operating ranges. Thus, in a 2.5-volt CMOS process, the NMOS and PMOS transistors are designed to operate up to and within a predefined tolerance level of 2.5 volts, typically ±10% of 2.5 volts. Furthermore, in a conventional 2.5-volt process, all the devices manufactured in the process have similar device characteristics, that is, all the devices are disposed to handle an operating supply voltage range of up to 2.5 volts. In the present description, this type of fabrication processes is referred to as a "single-voltage" fabrication process. In the present embodiment, when switch circuit 700 is fabricated in a conventional single-voltage fabrication process, PMOS devices P1 and P2 with the bootstrapped well connections are used advantageously to handle the high voltage conditions at nodes 706 and 708.

However, some semiconductor fabrication processes provide both high-voltage devices and standard-voltage devices in a single fabrication process sequence. This type of process is referred to as a "dual-voltage" fabrication process in the present description. Thus, in a "dual-voltage" process, the high-voltage devices are manufactured to handle a 5-volt operating voltage, for example, while the standard-voltage devices are manufactured to handle a 2.5-volt operating voltage, for example. The high-voltage devices of such a "dual-voltage" process can be used advantageously in the implementation of switch, circuit 700 of the present invention. According to another embodiment of the present invention, switch circuit 700 is fabricated using a dual-voltage process and devices P1 and P2 are fabricated as high-voltage transistors. In this embodiment, devices P1 and P2 can be high-voltage PMOS devices or they can be implemented as high-voltage NMOS devices with the polarity of the control signals altered accordingly.

In some circumstances, when switch circuit 700 is fabricated using a single-voltage fabrication process, the PMOS devices may not be able to handle the 2Vdd voltage level imposed at their device terminals, particularly for low-voltage fabrication processes. For example, in a 2.5-volt process, the maximum operating voltage for the PMOS or NMOS devices may be only 3.6 volts. In cases where switch circuit 700 is implemented using a low voltage fabrication process, the voltages at the high voltage nodes can be adjusted to accommodate the limited maximum operating voltage range. Thus, according to yet another embodiment of the present invention, the precharge voltage Vpc (node 728) of switch circuit 700 is chosen to have a voltage value equal to the difference between the maximum operating voltage and the power supply voltage of the fabrication process. Thus, in a 2.5-volt process with a 3.6-volt maximum operating voltage, the precharge voltage Vpc is set at 1.1 volts. Therefore, the voltage at high-voltage node 706 varies between 0 volt and 3.6 volts (Vdd+Vpc) and the voltage at node 708 varies between 2.5 volts (Vdd) and 3.6 volts (Vdd+Vpc). In the previous embodiment, when the precharge voltage is being held at the power supply voltage Vdd, the high voltage nodes can reach a voltage of 2Vdd or 5 volts which exceeds the maximum operating voltage of the PMOS devices. By providing a precharge voltage Vpc according to the description above and less than the power supply voltage, switch circuit 700 can be fabricated using low-voltage processes to provide a low distortion and high frequency switch circuit suitable for use in the low Vdd range.

Figure 8:
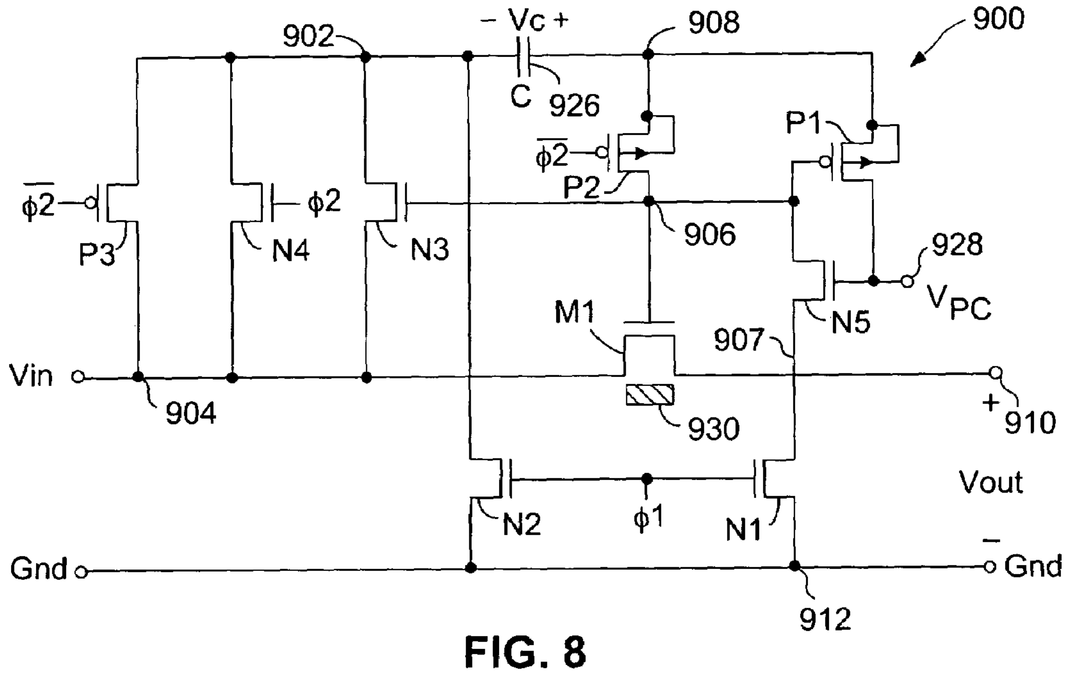
FIG. 8 is a transistor level circuit diagram of the switch circuit of FIG. 3 in accordance with an alternative embodiment of the present invention.

In FIG. 6, the drain terminal of transistor N1 is connected to node 706 which can attain a voltage level up to 2Vdd. Therefore, transistor N1 has to be a high voltage device itself, capable of sustaining a voltage of 2Vdd at its drain node without suffering from device failure due to voltage stress. FIG. 8 illustrates an alternate embodiment of the switch circuit of the present invention where conventional NMOS transistors can be used to implement the function of transistor N1. In FIG. 8, two transistors N5 and N6, connected in series, are used in place of transistor N1. Transistor N5 is connected between node 906 and node 907 and its gate is connected to Vpc node 928 which is held at the power supply voltage Vdd in the present embodiment. Thus, transistor N5 is always turned on. Transistor N6 is connected between node 907 and ground node 912 and its gate is connected to clock ϕ1. When transistor N6 is turned on by the action of clock φ1, transistors N5 and N6 distribute the voltage at node 906 between the drains of both of the transistors, thus reducing the drain to gate voltage stress across an individual transistor. In another embodiment, when the precharge voltage Vpc at node 928 is not the power supply voltage Vdd and instead is less than the Vdd voltage, the gate terminal of transistor N5 can be connected to the power supply voltage Vdd of switch circuit 900 instead of being connected to Vpc node 928. In this manner, sufficient gate-to-source voltage is provided to transistor N5 to turn the transistor on.

In the embodiments shown in FIGS. 6 and 8, capacitors 726 and 926 can be implemented as a MOS capacitor, an oxide capacitor, a junction capacitor, a polysilicon to polysilicon capacitor with an interlayer dielectric, or any other conventional capacitor structures. These capacitor structures can be manufactured using conventional integrated circuit fabrication process steps. In one embodiment, capacitors 726, 926 are each implemented as a polysilicon-dielectric-polysilicon capacitor (poly-to-poly capacitor) because a poly-to-poly capacitor structure can withstand high voltage stress without suffering from degradation. Furthermore, the capacitor (726 or 926) can be fabricated on the same integrated circuit as the switch circuit or the capacitor can be an "off-chip" capacitor, fabricated on a separate piece of integrated circuit apart from the rest of the circuit elements of the switch circuit.

In the embodiment shown in FIG. 6, transistor sizes for the NMOS and PMOS devices in switch circuit 700 are listed in Table 1. The capacitance of capacitor 726 has a value of 150 fF. However, it is understood by one skilled in the art that the transistor sizes and capacitor values can be varied while still achieving the result of the present invention.

TABLE 1

| TRANSISTOR | WIDTH | LENGTH |
|---|---|---|
| M1 | 2.6 μm | 0.5 μm |
| N1 | 2.6 μm | 0.5 μm |
| N2 | 1.1 μm | 0.5 μm |
| N3 | 2.6 μm | 0.5 μm |
| N4 | 2.6 μm | 0.5 μm |
| P1 | 1.1 μm | 0.5 μm |
| P2 | 1.1 μm | 0.5 μm |
| P3 | 2.6 μm | 0.5 μm |

Figure 9:
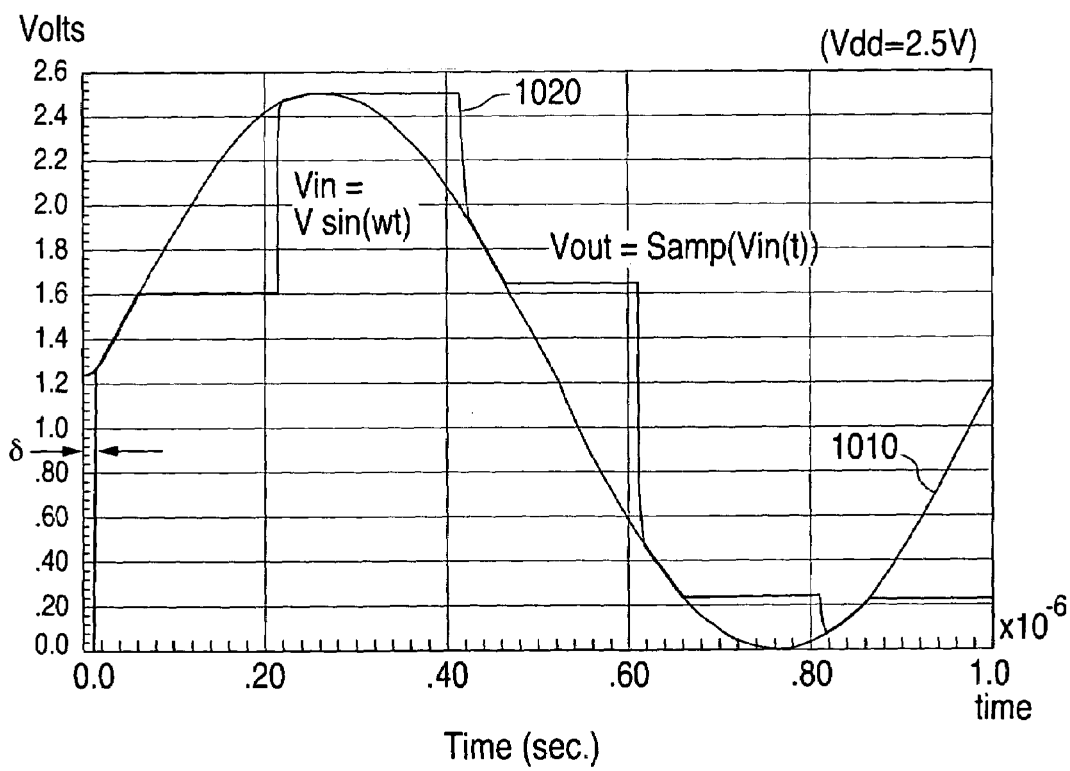
FIG. 9 is a graph of the input and output voltages versus time for the switch circuit of FIG. 6 which illustrates the behavior of the switch output voltage with respect to the input voltage.
Figure 10:
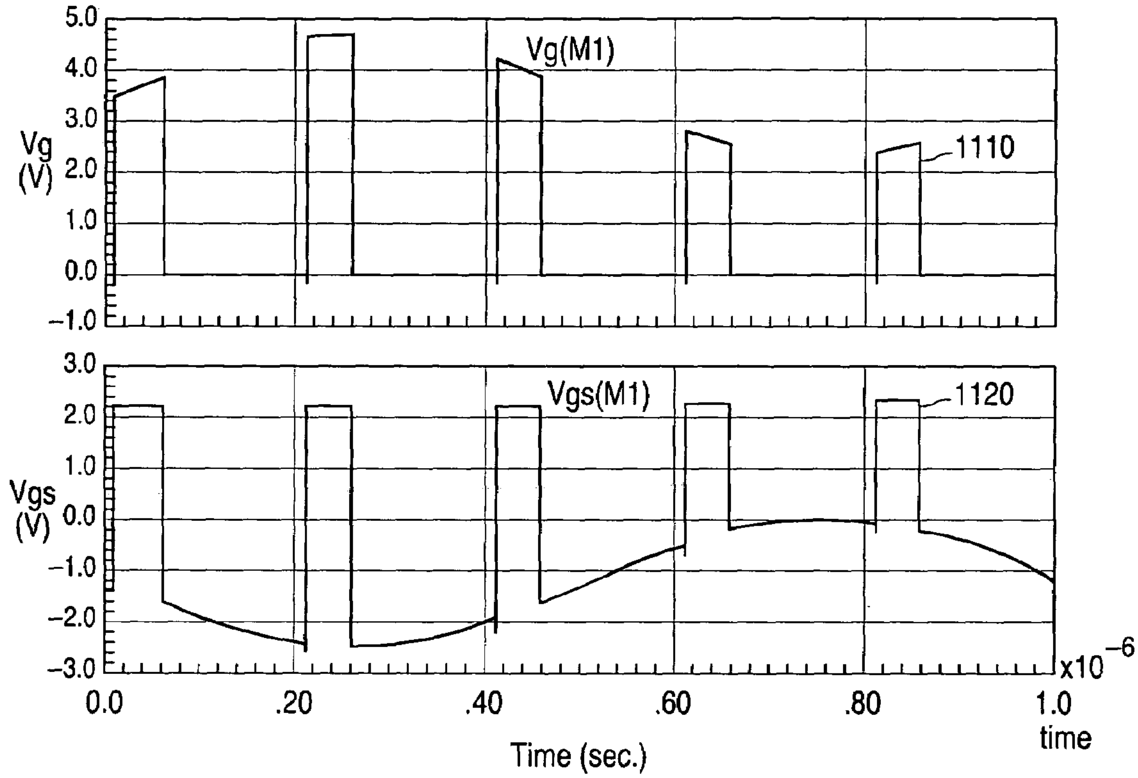
FIG. 10 is a graph of the gate voltage and the gate-to-source voltage versus time of transistor M1 in the switch circuit of FIG. 6 operating under the conditions in FIG. 9.

FIGS. 9 and 10 illustrate the simulation result of switch circuit 700 of FIG. 6 while driving a capacitive load at Vout node 710 and being employed as a track and hold circuit (or an integrator-less follow and hold circuit). In the following simulation result, switch circuit 700 is operated with a Vdd of 2.5 volts. The simulation result illustrates the significant performance improvement achieved by switch circuit 700 of the present invention, not only over prior art switch circuits running at low Vdd voltages but also over prior art switch circuits operating at conventional Vdd voltages (e.g. 5 volts).

FIG. 9 is a graph of the input and output voltages versus time for switch circuit 700 of FIG. 6 which illustrates the behavior of the switch output voltage with respect to the input voltage. Input voltage 1010 is a 1 MHz sinusoidal waveform having a peak to peak swing of 2.5V. Clocks φ1 and φ2 are programmed to sample input voltage 1010 during five intervals within one period of the input waveform. Referring to FIG. 9, when switch circuit 700 is turned on, output voltage 1020 responds after a delay of δ which is 10 ns in this embodiment. Output voltage 1020 follows input voltage 1010 closely during the 40 ns interval where switch circuit 700 is turned on. When switch circuit 700 is turned off, output voltage 1020 holds the input voltage value at that point (1.6V) until switch circuit 700 is turned on again at a time of 210 ns. For the next four intervals where switch circuit 700 is turned on, the same result is observed where output voltage 1020 tracks input voltage 1010 during those intervals and then holds the respective input voltage values when switch circuit 700 is turned off. When switch circuit 700 is turned on, output voltage 1020 is essentially equal to input voltage 1010, even when the values of input voltage 1010 are rapidly changing. Thus, switch circuit 700 is capable of operating at very high bandwidth, for example, up to several hundred megahertz. Furthermore, no frequency distortion is observed.

FIG. 10 is a graph of the gate voltage Vg and the gate-to-source voltage Vgs versus time of transistor M1 of switch circuit 700 of FIG. 6 operating under the conditions in FIG. 9. Vg curve 1110 shows that the gate voltage Vg of transistor M1 (node 706) follows the sinusoidal waveform of the input voltage and has a voltage value equaling Vin+αVdd when switch circuit 700 is on. In FIG. 10, Vg is 4.6V at its maximum, approaching the value of 2Vdd (5.0V). Vgs curve 1120 in FIG. 10 illustrates another important characteristic of the present invention. Vgs curve 1120 shows that gate-to-source voltage Vgs of switch circuit 700 is not a function of Vin when switch circuit 700 is on. In fact, whenever switch circuit 700 is turned on, gate-to-source voltage Vgs is a constant voltage having a value of 2.3V. Thus, in this simulation, αVdd is 2.3V and a has a value of 0.92. As described above, α approaches unity but does not equal unity because of charge sharing loss on capacitor 726.

Figure 11A:
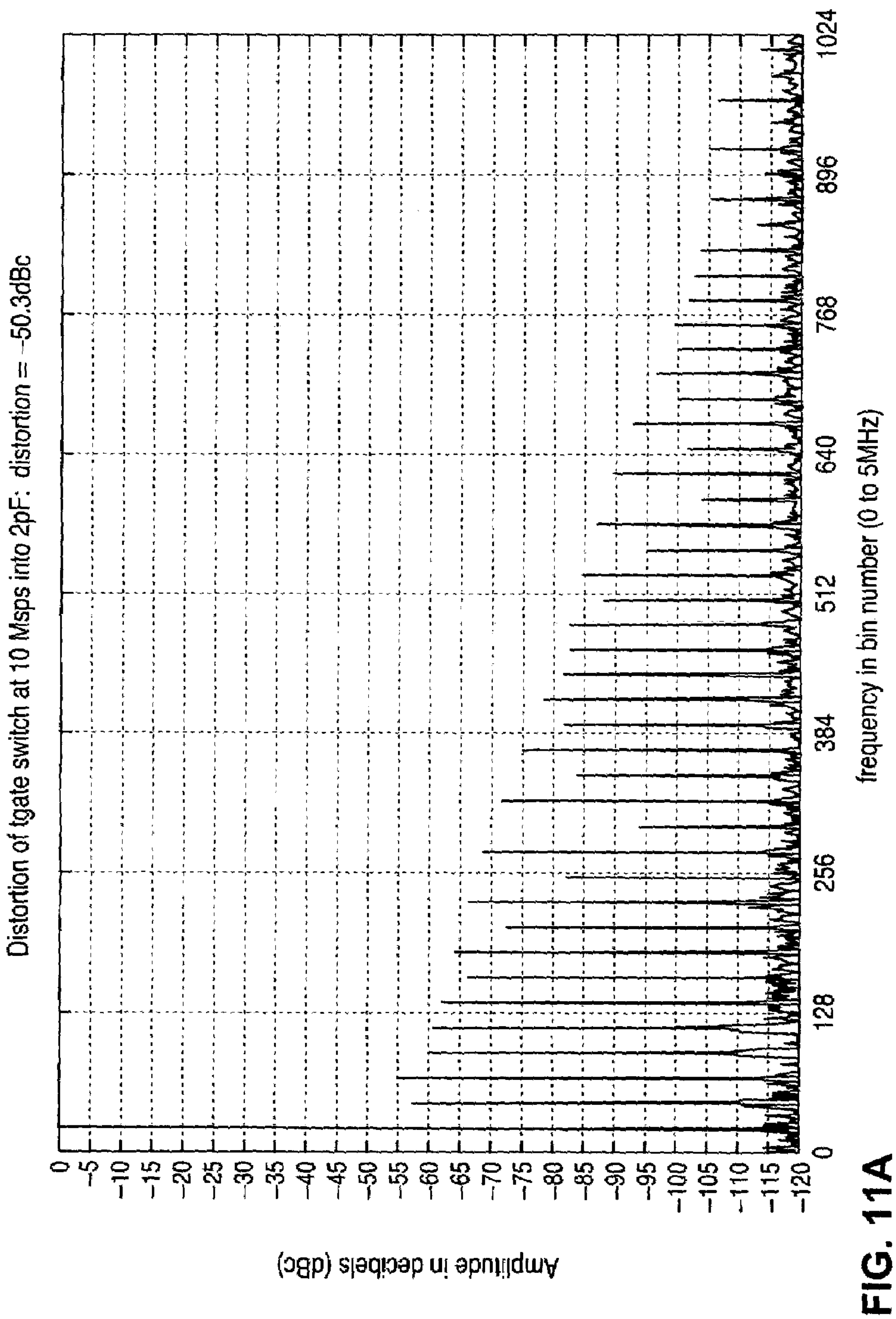
FIGS. 11A and 11B are frequency response plots of a conventional switch circuit and the switch circuit of the present invention, respectively, illustrating the improvement in distortion effect using the switch circuit of the present invention.
Figure 11B:
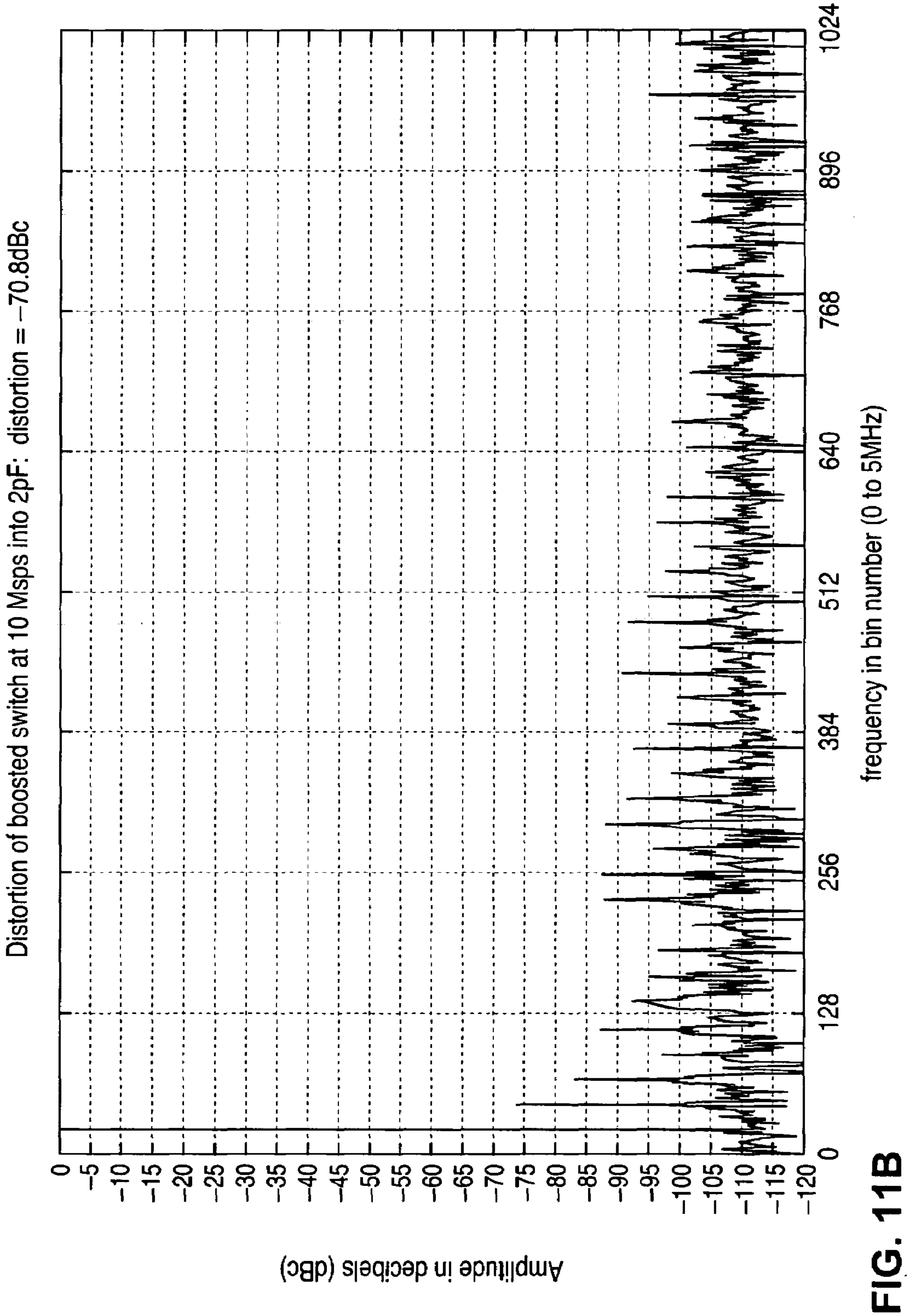

FIGS. 11A and 11B are frequency response plots of a conventional switch circuit and the switch circuit of the present invention, respectively, illustrating the improvement in distortion effect using the switch circuit of the present invention. In FIGS. 11A and 11B, switch circuit 700 is operated with Vdd at 2.5V while the conventional switch circuit is operated with Vdd at 5.0V. As can be observed by comparing FIGS. 11A and 11B, a significant reduction in amplitude of the undesirable high frequency components can be achieved using the switch circuit of the present invention. Specifically, the improvement in distortion effect observed is over 20 dB. The 20 dB improvement represents a 20 times reduction in distortion obtained with a switch circuit of the present invention operating at a lower Vdd voltage. The switch circuit of the present invention not only achieves improvement over prior art operating at the same low Vdd voltages, but also achieves significant improvement over prior art circuits operating at a higher or conventional Vdd values. The switch circuit of the present invention can be operated at Vdd values as low as 1.0V with a suitable low threshold and low Vdd fabrication process while still achieving significant improvement in bandwidth of operation and reduction in distortion effects.

FIGS. 6 and 8 illustrate two implementations of the switch circuit of the present invention for driving NMOS transistor M1 as the main switching device. One of ordinary skill in the art would appreciate that the circuits of FIGS. 6 and 8 can be altered accordingly to provide a complementary circuit for driving a PMOS transistor as the main switching device. Furthermore, as described above, switch circuit 700 or 900 can be combined with the complementary switch circuit for driving a CMOS transmission gate as the switching device.

In one application, the switch circuit of the present invention can be used to construct a high performance switch capacitor circuit. As it is well known in the art, a switch capacitor circuit includes three basis elements: a switch, a capacitor, and an amplifier. An amplifier capable of operating at very low voltage levels with uncompromised or even improved performances in transconductance is described in commonly assigned U.S. Pat. No. 6,147,550, entitled "Method And Apparatus For Reliably Determining Subthreshold Current Densities In Transconductance Cells," of Peter R. Holloway, issued Nov. 14, 2000; and also in commonly assigned U.S. Pat. No. 5,936,433, entitled "Comparator Including A Transconducting Inverter Biased To Operate In Subthreshold," of Peter R. Holloway, issued Aug. 10, 1999. Both of the aforementioned patents are incorporated herein by reference in their entireties. In accordance with the present invention, a high performance switch capacitor circuit capable of operating under very low Vdd voltages is built using the switch circuit of the present invention in combination with an amplifier based on the transconductance inverting cell technology described in the aforementioned patents.

Figure 12:
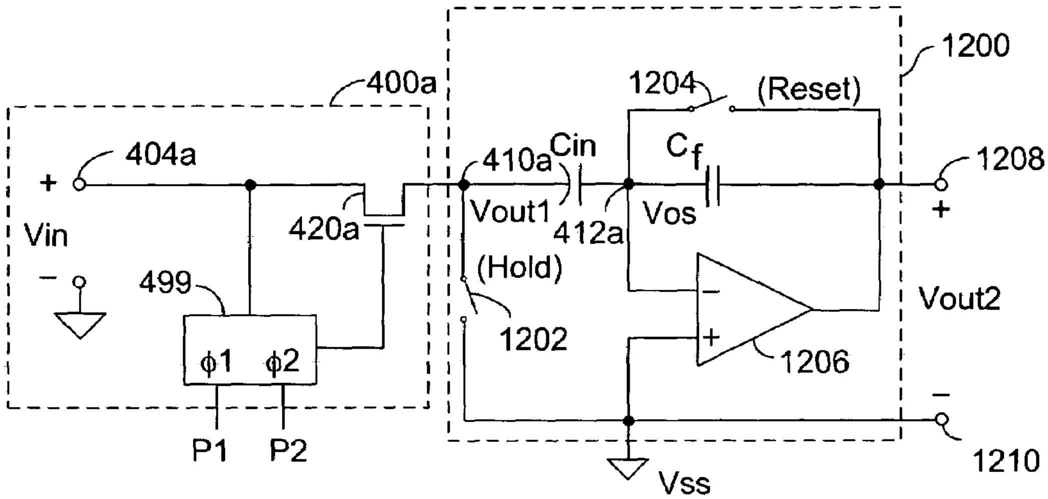
FIG. 12 is a circuit diagram of a bottom-sampled integrator incorporating the switch circuit of FIG. 3 in accordance with another embodiment of the present invention.

Another application of the switch circuit of the present invention is in a sample and hold circuit. FIG. 12 is a circuit diagram of a sample and hold circuit using bottom-plate sampling. In FIG. 12, the sample and hold circuit includes a constant $R_{ON}$ switch circuit 400*a* of the present invention coupled to a bottom-plate sampled integrator 1200. When bottom-sampled integrator 1200 is operated according to the timing diagram in FIG. 13, charge injection into the output terminal of switch circuit 400*a* is eliminated and integrator 1200 operates with the lowest level of distortion, even at low Vdd levels. As is well understood in the art, bottom-plate sampling is preferred over top-plate sampling in analog-to-digital conversion because bottom-plate sampling has the advantage of eliminating charge injection errors at the output terminal of the switch circuit.

Referring to FIG. 12, switch circuit 400*a* is depicted in a simplified form as including an NMOS switching transistor 420*a* and a switch control circuit 499. Switch control circuit 499 represents the combination of switches and the capacitor required for the switch circuit operation. In FIG. 12, switch circuit 400*a* operates under the timing control of clocks $\phi$1 and $\phi$2 as previously described. Switch circuit 400*a* receives input voltage Vin at node 404*a* and provides a corresponding output voltage Vout1 at node 410*a*.

Integrator 1200 includes a capacitor Cin, serving as the sampling capacitor. Capacitor Cin is connected between node 410*a*, the switch output voltage (Vout1), and a node 412*a*. Integrator 1200 further includes a hold switch 1202 and a reset switch 1204. Hold switch 1202, connected between Vout1 node 410*a* and ground node 1210, operates according to the timing control of clock H in FIG. 13. Reset switch 1204, connected between nodes 412*a* and 1208, operates according to the timing control of either clock R1 or clock R2. Reset switch 1204 controls the reset and integrate operations of integrator 1200. When Reset switch 1204 is closed, node 412*a* is being reset. When Reset switch 1204 is open node 412*a* is being integrated. As will be described in more detail below, clocks R1 and R2 permit integrator 1200 to operate either in the inverting sampling mode or the non-inverting sampling mode, respectively.

Figure 13:
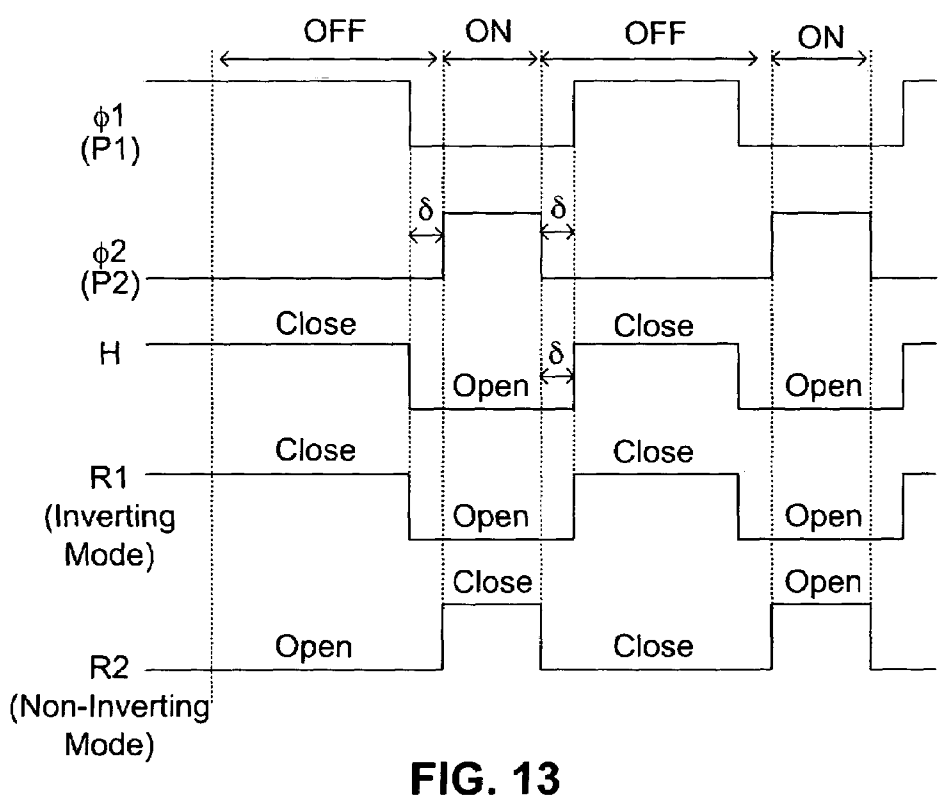
FIG. 13 is a timing diagram illustrating the operation of the bottom-sampled integrator of FIG. 12.

The operation of bottom-sampled integrator 1200 is well known in the art and will now be described in brief. When switch circuit 400*a* is off (i.e., the switch is open), hold switch 1202 is closed to drive Vout1 node 410*a* to the ground potential. Alternately, when switch circuit 400*a* is on (i.e., the switch is close), hold switch 1202 is open allowing voltage Vout1 to charge the bottom plate of capacitor Cin. Integrator 1200 employs a non-overlapping clock drive technique well known in the art. Referring to FIG. 13, clocks P1, P2, H, and R1/R2 do not overlap with each other. For example, a delay of 6 is included in clock P2 to ensure that switch circuit 400*a* does not get turned on until some time after hold switch 1202 is opened. Similarly, switch circuit 400*a* is turned off a time $\delta$ before hold switch 1202 is closed.

Referring to FIG. 12, the top plate (node 412*a*) of capacitor Cin is connected to the negative input terminal of an operational amplifier 1206, to the top plate of capacitor $C_f$ and to a terminal of reset switch 1204. Capacitor $C_f$ and reset switch 1204 are connected in parallel between nodes 412*a* and integrator output voltage (Vout2) node 1208. Because the positive input terminal of amplifier 1206 is grounded, amplifier 1206 generates a corresponding output voltage Vout2 at node 1208 to keep the negative input terminal (node 412*a*) at ground potential. Output voltage Vout2 acts on node 412*a* either through capacitor $C_f$ or through reset switch 1204 when closed. As such connected, node 412*a* behaves as a virtual ground as is well understood in the art.

The operation of integrator 1200 in the inverting mode of operation where reset switch 1204 is controlled by clock R1 is now described. When switch circuit 400*a* is off (i.e., open), both hold switch 1202 and reset switch 1204 are closed and thus, both the bottom plate (node 410*a*) and the top plate (node 412*a*) of capacitor Cin are at ground. Voltage Vout2 at node 1208 is also at ground by the action of Reset switch 1204. When switch circuit 400*a* is on, then input voltage Vin at node 404*a* is provided to output voltage Vout1 node 410*a*. Note that switch circuit 400*a* turns on a delay time $\delta$ after hold switch 1202 and reset switch 1204 are open, consistent with the non-overlapping clocking technique employed here. Thus, the change in voltage across capacitor Cin, denoted $\Delta V_{cin}$, equals the input voltage Vin. The change in charge that flows through capacitor Cin is given by:

$$\Delta Q = Vin*Cin.$$

As those skilled in the art understand, in the bottom-plate sampling technique, all the charge introduced to the bottom plate of capacitor Cin is transferred to its top plate and charge injection into the source terminal of NMOS transistor 420 is avoided. Thus, in bottom-sampled integrator 1200, no error voltage develops across the sampling capacitor (Cin) as is the case when top-plate sampling is used.

In response to the change in voltage at capacitor Cin, the voltage at node 412*a* rises to a value of Vin. Operational amplifier 1206 acts to keep voltage 412*a* at ground potential. Thus, the integrator output voltage Vout2 becomes:

$$Vout2 = -\frac{Cin}{C_f} Vin.$$

So in the case when Cin=$C_f$, Vout2 will equal −Vin when switch circuit 400*a* is on.

When integrator 1200 is operated in the non-inverting sampling mode, switch circuit 400*a* and hold switch 1202 are controlled by clocks P1, P2 and H and operate in the same manner as in the inverting sampling mode. However, reset switch 1204 is now controlled by clock R2 (FIG. 13) which behaves in reverse of clock R1. In the non-inverting sampling mode, reset switch 1204 opens and closes in concert with switch circuit 400*a*. When switch circuit 400*a* is turned off, the voltage at the bottom and the top plates of capacitor Cin (nodes 410*a* and 412*a*) are at ground but the voltage Vout2 is not yet determined initially.

When switch circuit 400*a* turns on, reset switch 1204 closes forcing voltage Vout2 to ground. Meanwhile, switch circuit 400*a* charges the bottom plate of capacitor Cin (node 410*a*) to voltage Vin. When switch circuit 400*a* turns off again, reset switch 1204 also opens. After a delay of δ, hold switch 1202 closes, forcing node 410*a*, previously charged to Vin, to ground potential. The top plate of capacitor Cin (node 412*a*), in response, drops to a voltage of −Vin. The change in charge (ΔQ) which flows through Cin equals Vin*Cin. Operational amplifier 1206 produces the appropriate voltage at Vout2 to drive node 412*a* back up to ground potential. Thus, integrator output voltage Vout2 becomes:

$$Vout2 = \frac{Cin}{C_f} Vin.$$

Thus, when Cin and $C_f$ are equal in capacitance, Vout2 equals Vin when switch circuit 400*a* is off. One skilled in the art will appreciate that the ratio of capacitance of capacitor $C_f$ and Cin can be selected to provide a desired gain for integrator 1200 operating either in the inverting sampling mode or the non-inverting sampling mode.

Returning to FIG. 8, when switch circuit 900 is turned on, a channel charge $Q_{ch\text{-}on}$ (denoted as a charge packet 930) is formed in the channel region of switching transistor M1 which is the main switching device of the switch circuit. When the switch circuit is turned off, channel charge $Q_{ch\text{-}on}$ has to be pulled out of the gate terminal of transistor M1. In some application, the action of pulling the channel charge $Q_{ch\text{-}on}$ out of transistor M1 can cause charge injection at the output terminal of the transistor. This type of charge injection can introduce an error voltage at the output terminal of the switch circuit (i.e. node 910), negatively impacting the accuracy and performance of the switch circuit.

Figure 14:
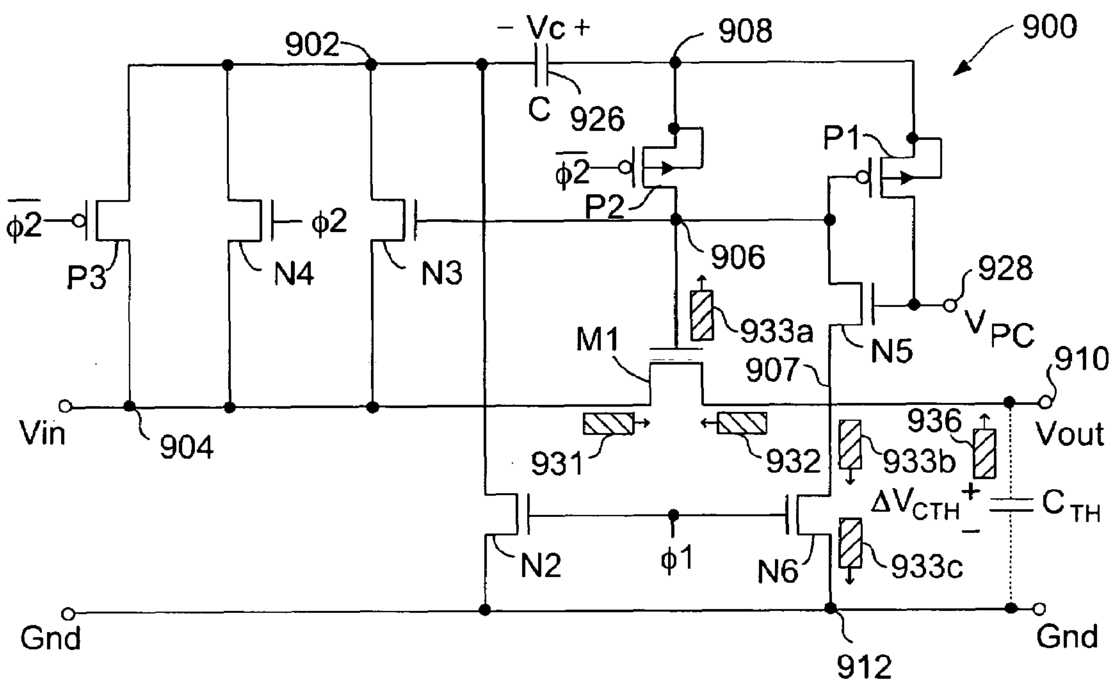
FIG. 14 is a circuit diagram of the switch circuit of FIG. 8 applied in a track and hold circuit application.

Pedestal errors present particular problems when a switch circuit is used in an track and hold application. FIG. 14 illustrates the use of switch circuit 900 of FIG. 8 in a track and hold operation when a capacitor $C_{TH}$ is coupled between the output terminal (node 910) of switch circuit 900 and ground. In operation, charge injection into the source/drain terminals of the switching device M1 can introduce pedestal errors at the output voltage Vout in the form of an error voltage (also referred to as a "pedestal voltage"), resulting in degraded circuit performance. Note that charge injection induced pedestal errors can affect any switch circuit, not just the switch circuit of the present invention. FIG. 14 is used merely as one example of a switch circuit configured for track and hold operations.

While the pedestal errors typically involve small voltage values, such as about 10 mV, such pedestal errors can become significant in low Vdd applications where the output voltage swing can be less than 2 volts. Conventional methods for reducing or compensating pedestal errors typically involve providing a circuit which attempts to generate a compensating charge matching the injected charge. The conventional charge compensating methods have several disadvantages and do not provide satisfactory result. This is because the compensating charge generated by the conventional compensation circuits may not match the injected charge accurately and may itself include variations which are added to the pedestal errors. Thus, even though the conventional compensation circuits are capable of reducing the magnitude of the pedestal voltage, the variations introduced by the compensation circuits are added on top of the variations already existing in the pedestal voltage which can lead to undesirable results. In accordance with another aspect of the present invention, a pedestal voltage compensation circuit is provided which can be incorporated in a switch circuit for effectively reducing charge-injection induced pedestal errors in the switch circuit, thereby enhancing the performance of the switch circuit.

In the following description, the pedestal voltage compensation circuit of the present invention is described as being incorporated into the switch circuit of the present invention. This is illustrative only and one of ordinary skill in the art would appreciate that the pedestal voltage compensation circuit of the present invention can be incorporated into any switch circuit for charge-injection compensation.

First, the operation of the switch circuit 900 resulting in pedestal errors at the output voltage terminal of the switch circuit is explained. Referring to FIG. 14, track and hold capacitor $C_{TH}$ is coupled between the output voltage Vout terminal (node 910) and ground (node 912). When switch circuit 900 is turned on, a channel charge $Q_{ch\text{-}on}$ (such as charge 930 in FIG. 8) is formed in the channel region of transistor M1. When transistor M1 is turned off, the channel charge $Q_{ch\text{-}on}$ is pulled out of the gate terminal of transistor M1. Pulling the channel charge out of the gate terminal of transistor M1 causes the same amount of charge to be drawn from the source and drain terminals of the transistor. For ease of discussion below, the terminal of transistor M1 connected to node 904 will be referred to as the "source" terminal and the terminal of transistor M1 connected to node 910 will be referred to as the "drain" terminal. Of course, one of ordinary skill in the art would appreciate that the source and drain terminals of a switching transistor, such as transistor M1, is interchangeable in operation. In FIG. 14, charge packet 933*a* represents the channel charge $Q_{ch\text{-}on}$ being pulled out of the channel of transistor M1. When transistor M1 is turned off, transistors N5 and N6 are turned on to couple the gate terminal of transistor M1 to ground (node 912). Thus, in FIG. 14, charge packet 933*a*, representing $Q_{ch\text{-}on}$, is illustrated as traveling through transistor N5 to node 907 (packet 933*b*) and eventually to ground node 912 (packet 933*c*) where the channel charge is dissipated.

Charge packets 931 and 932 represent the charge being drawn out of the source and drain terminals, respectively, of transistor M1 in response to the channel charge (packet 933*a*) being pulled out of the gate terminal of the transistor. When transistor M1 is turned off rapidly, the channel charge will most likely be partitioned equally between the source and drain terminals. Thus, charge packets 931 and 932 each equals $-Q_{ch\text{-}on}/2$. In the case when the charge drawn is not equally partitioned between the source and drain terminals, the sum of the charge of packets 931 and 932 is the channel charge $Q_{ch\text{-}n}$. The charge being pulled out of the drain terminal of transistor M1, i.e. charge packet 932, causes charge injection from output voltage node 910, represented by charge packet 936. The charge injection into the drain terminal of transistor M1 introduces a pedestal error in the output voltage Vout, denoted as error voltage $\Delta V_{CTH}$. The error voltage is given as follows:

$$\Delta V_{CTH} = \frac{\Delta Q_{CTH}}{C_{TH}} = \frac{Q_{936}}{C_{TH}};$$
$$= \frac{-Q_{ch\text{-}on}}{2 * C_{TH}};$$

where $\Delta Q_{CTH}$ is the change in the charge at the output voltage terminal (node 910) caused by the charge injection. The magnitude of the change is represented by charge packet 936 which has a value of $-Q_{ch\text{-}in}/2$, the same value as charge packet 932, when the channel charge is split equally between the source and drain terminals of transistor M1. Of course, when the channel charge is not equally partitioned between the source and drain terminals, the error voltage will depend on the charge drawn out of output voltage node 910 (packet 936) due to the charge drawn out of the drain terminal of transistor M1 (packet 932). Typically, the error voltage $\Delta V_{CTH}$ has a magnitude of about 10 mV. This charge injection induced pedestal voltage at the output voltage terminal can negatively impact the performance of the switch circuit. Furthermore, because the channel charge $Q_{ch\text{-}on}$ is affected by Poisson noise, successful pedestal voltage compensation needs to take into account these variations in the channel charge in order to provide satisfactory compensation result.

Figure 15:
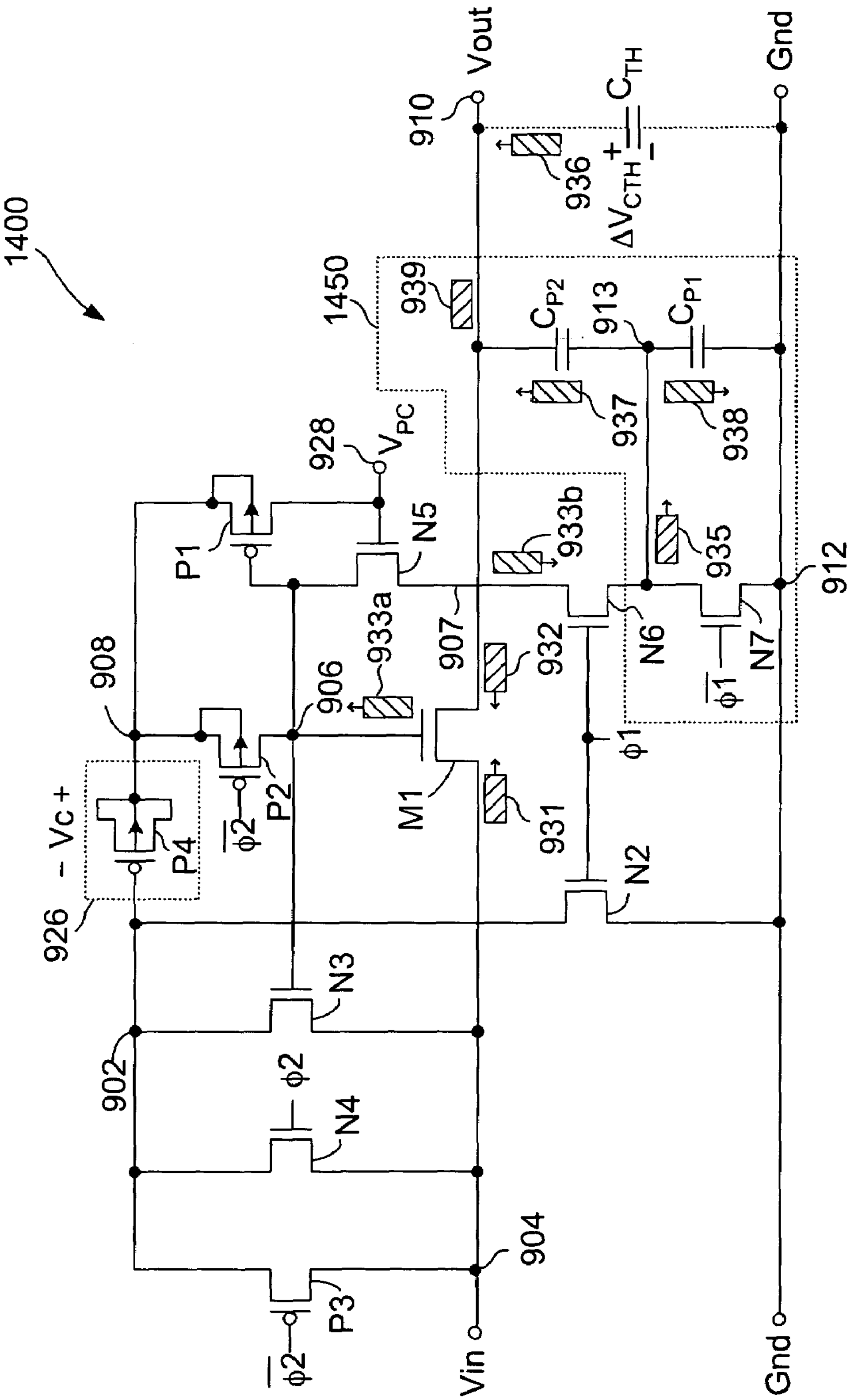
FIG. 15 is a transistor level circuit diagram of the switch circuit of FIG. 8 incorporating a pedestal voltage compensation circuit according to one embodiment of the present invention.

FIG. 15 is a transistor level circuit diagram of the switch circuit of FIG. 8 incorporating a pedestal voltage compensation circuit according to one embodiment of the present invention. Like elements in FIG. 8 and FIG. 15 are given like reference numerals and will not be further described.

In the embodiment shown in FIG. 15, capacitor 926 is implemented as a MOS capacitor by using a PMOS transistor P4. The gate terminal of transistor P4 is connected to node 902. The drain and source terminals of transistor P4 are both connected to node 908. In the present embodiment, the size of transistor P4 is 8 μm by 8 μm and the gate capacitance is about 170 fF. In one embodiment, transistor P4 is placed within the same N well with transistors P1 and P2 for proper substrate biasing to avoid junction breakdown between the source and drain terminals and the N well of transistor P4. In an alternative embodiment, transistor P4 can be placed in an N well separate from the N well in which transistors P1 and P2 are placed. In that case, the N well of transistor P4 is individually connected to node 908. According to yet another embodiment of the present invention, switch circuit 1400 is fabricated using a dual-voltage process and transistors P1, P2 and P4 are fabricated as high-voltage transistors.

Pedestal voltage compensation circuit 1450 of switch circuit 1400 of FIG. 15 is implemented as a capacitor divider circuit including a capacitor $C_{P1}$ and a capacitor $C_{P2}$ having equal capacitance values. As will be described in more detail below, the capacitor divider circuit of capacitors $C_{P1}$ and $C_{P2}$ provides auto-compensation of the injected charge so that pedestal errors occurring at the output voltage terminal due to charge injection can be accurately compensated. Pedestal voltage compensation circuit 1450 also includes an NMOS transistor N7 coupled between the source terminal (node 913) of transistor N6 and ground (node 912). Transistor N7 functions primarily to restore the DC voltage at the source terminal of transistor N6 which would have been connected to the ground node when no compensation circuit is provided. Transistor N7 is controlled by the clock signal φ1(inv) and thus is operated in the opposite state as transistor N6. That is, when transistor N6 is turned on, transistor N7 is turned off, and vice versa. The source terminal of transistor N6 is connected to the common node (node 913) of the capacitor divider circuit. The common node (node 913) of the capacitor divider circuit refers to the node between capacitors $C_{P1}$ and $C_{P2}$.

In accordance with the present invention, the charge generated by pedestal voltage compensation circuit 1450 to compensate for the injected charge at the drain terminal of transistor M1 is derived from the injected charge itself. In effect, pedestal voltage compensation circuit 1450 provides auto-compensation of any injected charge so that the injected charge is compensated accurately, even if the injected charge includes variations due to Poisson noise. The pedestal voltage compensation scheme of the present invention represents a marked improvement over conventional compensation techniques where the compensating charge is typically generated by a separate source seeking to match the injected charge. It is difficult to achieve accurate charge compensation in the conventional compensation techniques because of variations in the injected charge and in the compensating charge itself.

The operation of pedestal voltage compensation circuit 1450 will now be described with reference to FIG. 15. In FIG. 15, when transistor M1 is turned off, the channel charge $Q_{ch\text{-}on}$ (charge packet 933*a*) is pulled out of the gate terminal of the transistor, causing charges (packets 931 and 932) to be drawn from the source and drain of the transistor. Charge packet 932, in turn, causes charge to be drawn out of the output voltage node 910, represented by charge packet 936. As described above, typically, the channel charge $Q_{ch\text{-}on}$ is divided equally between the source and drain terminals. Thus, charge packet 936 consists of $-Q_{ch\text{-}on}/2$. In some circumstances, such as when transistor M1 is turned off slowly, the carriers in the channel may have sufficient time to drift under the influence of lateral electric fields. In that case, the drifting of the carriers in the channel of transistor M1 may affect the partitioning of the channel charge. In the following descriptions, it is assumed that transistor M1 is turned off rapidly and that the charge partition between the source and drain terminals of the transistor is equal so that charge packet 931 equals charge packet 932, each consisting of $-Q_{ch\text{-}on}/2$.

Charge packet 933*a* pulled out of the gate terminal of transistor M1 is coupled through transistors N5 and N6 to node 913 (illustrated as packet 933*b*) where, instead of being absorbed into the ground node when no compensation circuit is included, the channel charge is pulled into the capacitor divider circuit (illustrated as packet 935). Charge packet 933*b* is directed through node 913 to the capacitor divider circuit through the action of transistor N7. As described above, transistors N6 and N7 are controlled by opposite clock signals. Thus, when transistor M1 is to be turned off, transistor N6 is turned on while transistor N7 is turned off. Transistor N7, being an open circuit, prevents the channel charge (packet 933*b*) from bleeding to ground. Instead, charge packet 935, consisting of the channel charge $Q_{ch\text{-}on}$, is forced through node 913 to the capacitor divider circuit.

At the capacitor divider circuit, charge packet 935 is divided into charge packets 937 and 938 by the action of capacitors $C_{P1}$ and $C_{P2}$. Because the capacitance of capacitors $C_{P1}$ and $C_{P2}$ are equal, the charge is divided equally between the two capacitors. Specifically, the charge in each of packets 937 and 938 is given as follows:

$$Q_{937} = Q_{938} = \frac{C_{P2}}{C_{P1} + C_{P2}} * (+Q_{ch\text{-}on})$$

$$\approx +\frac{1}{2}Q_{ch\text{-}on}, \text{ when } C_{P1} = C_{P2}$$

where $C_{P1}$ and $C_{P2}$ are used in the above equations to refer to the capacitance of capacitors $C_{P1}$ and $C_{P2}$. Charge packet 937, having a charge of $+Q_{ch\text{-}on}/2$, is provided to node 910 which is combined with charge packet 936, having a charge of $-Q_{ch\text{-}on}/2$. Thus, the total charge at node 910, represented by a charge packet 939 is the sum of charge packet 937 and charge packet 936 and is zero. In this manner, the capacitor divider circuit of pedestal voltage compensation circuit 1450 generates a compensating charge (charge packet 937) which is derived directly from the channel charge $Q_{ch\text{-}on}$. Any variations in the channel charge value, such as those caused by Poisson noise, will be duplicated in charge packet 937 and charge compensation can be achieved with a high degree of accuracy.

The error voltage $\Delta V_{CTH}$ in switch circuit 1400 is given as follows:

$$\Delta V_{CTH} = \frac{\Delta Q_{CTH}}{C_{TH}} = \frac{Q_{939}}{C_{TH}};$$
$$= \left(\frac{1}{2} + \left(-\frac{1}{2}\right)\right)\frac{Q_{ch-on}}{C_{TH}} = 0.$$

Because pedestal voltage compensation circuit 1450 generates a compensating charge (packet 937) which effectively and accurately cancels out the injected charged (packet 936) at the output voltage terminal (node 910), the charge injection-induced error voltage $\Delta V_{CTH}$ is eliminated. Note that charge packet 938 is dissipated to ground (node 912) through capacitor $C_{P1}$.

It is important to note that while in FIGS. 14 and 15 and in the above descriptions, the charge transfer operations in the switch circuits are described as being occurred in the form of "charge packets," the charge packets are illustrative only and are used merely to facilitate the above discussion. Of course, one of ordinary skill in the art would appreciate that, in actuality, the charge transfer operations in the switch circuits do not occur in packets. The charge packets in FIGS. 14 and 15 are merely used to illustrate the magnitude and the movement of the charges within the switch circuits.

Capacitors $C_{P1}$ and $C_{P2}$ can have a wide range of capacitance values. For effective charge cancellation while not affecting other performance characteristics of switch circuit 1400, the capacitance of capacitors $C_{P1}$ and $C_{P2}$ can have a value of approximately one-fifth of the capacitance of track and hold capacitor $C_{TH}$. If the capacitance values of capacitors $C_{P1}$ and $C_{P2}$ are too small, the voltage at node 913 may be perturbed by charge injection at node 910 and the compensating charge may be affected accordingly, although to a very small degree. On the other hand, the maximum capacitance values of capacitors $C_{P1}$ and $C_{P2}$ can be up to 100% of the $C_{TH}$ capacitance value. The capacitor divider circuit of pedestal voltage compensation circuit 1450 is able to divide the charge from charge packet 935 noiselessly. Thus, compensation circuit 1450 does not introduce additional noise into switch circuit 1400.

As described above, transistor N7 functions to restore the DC voltage at the source terminal of transistor N6 whenever switch transistor M1 is turned on. While in the embodiment shown in FIG. 15, transistor N7 restores the voltage at the source terminal of transistor N6 to ground, it is also possible to restore the source voltage of transistor N6 to other voltage values. In those cases, the source terminal of transistor N7 can be coupled to the appropriate voltage terminals providing the desired DC voltage for transistor N6.

In the above description, pedestal voltage compensation circuit 1450 is shown coupled to the switch circuit of FIG. 8 where transistors N5 and N6 are used to implement switch 422 of FIG. 3. Of course, this is illustrative only and the pedestal voltage compensation circuit of the present invention can be applied to other embodiments of the present invention such as switch circuit 700 of FIG. 6. In one embodiment, when the pedestal voltage compensation circuit of the invention is incorporated in switch circuit 700, transistor N7 is coupled to the source of transistor N1 and the capacitor divider circuit is coupled between the output voltage Vout terminal (node 710) and ground (node 712). Of course, the source terminal of transistor N7 can be coupled to ground node 712 or to a selected reference voltage for setting the DC voltage at the source terminal of transistor N6 when the switch circuit is turned on.

FIG. 15 illustrates a pedestal voltage compensation circuit as applied to a switch circuit of the present invention including an NMOS switching transistor M1. Of course, the pedestal voltage compensation circuit of the present invention can also be applied to a switch circuit of the present invention including a PMOS switching transistor or a CMOS transmission gate as the switching device. Furthermore, the pedestal voltage compensation circuit of the present invention can be applied to other switch circuits and is not limited to being used with the switch circuit of the present invention. The pedestal voltage compensation circuit of the present invention can be effective in eliminating pedestal errors in any switch circuits operating in a track and hold operations. Moreover, besides being used with switch circuits, the pedestal voltage compensation circuit of the present invention can also be applied to other circuits where compensation for charge injection induced errors is desired. For example, pedestal voltage compensation circuit of the present invention can also be applied in integrator 1200 of FIG. 12 for eliminating charge injection induced errors at node 412*a* of reset switch 1204 due to non-ideal device characteristics of switch 1204.

In one embodiment, the capacitor divider circuit of the pedestal voltage compensating circuit can be coupled between node 412*a* (the sensitive node) and node 1208. An extracted charge is derived from the channel charge of the switching transistor in switch 1204. The extracted charge is directed to the common node of the capacitor divider circuit by any conventional means. The first capacitor provides the compensating charge at the sensitive node (412*a*). The second capacitor dissipates the divided charge at node 1208 which is an Ac voltage node. However, the dissipation of the divided charge at node 1208 only causes a transient error and therefore does not impact circuit operation.

In summary, the pedestal voltage compensation circuit of the present invention can be applied to any circuit for compensating injected charge at a sensitive terminal, usually an output terminal, of the circuit. The pedestal voltage compensation circuit of the present invention operates by extracting a complement of a source charge (referred to as the extracted charge) where the source charge is the charge causing the charge injection to occur at the sensitive terminal. For example, the source charge can be the channel charge of a switching transistor. Then, the pedestal voltage compensation circuit operates to divide the extracted charge into a compensating charge, and using the compensating charge to compensate for the injected charge at the sensitive terminal.

In one embodiment, the extracted charge is divided using a capacitor divider circuit. The extracted charge is directed to the common node of the capacitor divider circuit. The first capacitor of the capacitor divider circuit is connected to the sensitive node to which the compensating charge is coupled. In this manner, the compensating charge cancels out the injected charge. The second capacitor is coupled to a low impedance node where the divided charge is dissipated. The second capacitor may be coupled to a node with a DC voltage, such as ground, or a node with an AC voltage. If the second capacitor is coupled to a node with an AC voltage, the node should be one where injection of the divided charge does not impact circuit operation or causes only inconsequential impact on the AC voltage at that node.

The above detailed descriptions are provided to illustrate the specific embodiments of the present invention and are not intended to be limiting. Numerous modifications and variations within the scope of the present invention are possible. The present invention is defined by the appended claims.

What is claimed is:

1. A switch circuit for selectively coupling an input terminal to an output terminal comprising:

a switching device coupled between said input terminal and said output terminal, said switching device having a control terminal;

a charge storage device having a first terminal, and a second terminal;

a first switch coupled to said control terminal of said switching device, said first switch having a first position coupled to a first supply voltage and a second position being an open circuit;

a second switch coupled to said first terminal of said charge storage device, said second switch having a first position coupled to a second supply voltage and a second position coupled to said control terminal of said switching device; and a third switch coupled to said second terminal of said charge storage device, said third switch having a first position coupled to said first supply voltage and a second position coupled to said input terminal;

wherein said first, second and third switches are in said first positions for turning off said switch circuit in response to a first clock signal, and said first, second and third switches are in said second positions for turning on said switch circuit in response to a second clock signal; and wherein said first and second switches are coupled to said first positions responsive to said first clock signal a predetermined delay time after said second and third switches are disconnected from said second positions responsive to said second clock signals.

2. The switch circuit of claim 1, wherein said second and third switches are coupled to said second positions responsive to said second clock signal a predetermined delay time after said first and second switches are disconnected from said first positions responsive to said first clock signals.

3. The switch circuit of claim 1, wherein said switching device electrically connects said input terminal of said switch circuit to said output terminal when said first, second and third switches are in said second positions.

4. The switch circuit of claim 1, wherein said charge storage device is charged to a voltage value being the difference between said second supply voltage and said first supply voltage when said second and third switches are in said first positions.

5. The switch circuit of claim 1, wherein said first supply voltage is a ground voltage.

6. The switch circuit of claim 5, wherein said charge storage device is charged to said second supply voltage when said second and third switches are in said first positions.

7. The switch circuit of claim 6, wherein said second supply voltage is a power supply voltage of said switch circuit.

8. The switch circuit of claim 6, wherein said second supply voltage is a voltage less than a power supply voltage of said switch circuit.

9. The switch circuit of claim 6, wherein said second supply voltage is a voltage exceeding a power supply voltage of said switch circuit.

10. The switch circuit of claim 1, wherein said charge storage device comprises a capacitor.

11. The switch circuit of claim 10, wherein said charge storage device comprises a MOS capacitor.

12. The switch circuit of claim 10, wherein said charge storage device comprises an oxide capacitor.

13. The switch circuit of claim 10, wherein said charge storage device comprises a polysilicon-dielectric-polysilicon capacitor.

14. The switch circuit of claim 1, wherein a resistance between said input terminal and said output terminal of said switch circuit is substantially constant when said first, second and third switches are in said second positions.

15. The switch circuit of claim 1, wherein said switching device comprises a first NMOS transistor having a first current handling terminal coupled to said input terminal, a second current handling terminal coupled to said output terminal, and a gate terminal being said control terminal of said switching device.

16. The switch circuit of claim 15, wherein said first switch comprises a second NMOS transistor having a first current handling terminal coupled to said gate terminal of said first NMOS transistor, a second current handling terminal coupled to said first supply voltage, and a gate terminal driven by said first clock signal.

17. The switch circuit of claim 15, wherein said first switch comprises a second NMOS transistor and a third NMOS transistor connected in series, said second NMOS transistor having a first current handling terminal coupled to said gate terminal of said first NMOS transistor, a second current handling terminal coupled to a first current handling terminal of said third NMOS transistor, and a gate terminal coupled to a power supply voltage Vdd of said switch circuit; and said third NMOS transistor having a second current handling terminal coupled to said first supply voltage, and a gate terminal driven by said first clock signal.

18. The switch circuit of claim 15, wherein said second switch comprises a first PMOS transistor having a first current handling terminal coupled to said second supply voltage, a second current handling terminal coupled to said first terminal of said charge storage device, and a gate terminal connected to said gate terminal of said first NMOS transistor.

19. The switch circuit of claim 18, wherein said second switch further comprises a second PMOS transistor having a first current handling terminal coupled to said gate terminal of said first NMOS transistor, a second current handling terminal coupled to first terminal of said charge storage device, and a gate terminal driven by a signal corresponding to said second clock signal.

20. The switch circuit of claim 19, wherein said signal corresponding to said second clock sigal is an inverse of said second clock signal.

21. The switch circuit of claim 18, wherein said second switch further comprises a second PMOS transistor having a first current handling terminal coupled to said gate terminal of said first NMOS transistor, a second current handling terminal coupled to first terminal of said charge storage device, and a gate terminal driven by said first clock signal, whereby said switch circuit is be turned on and off in response to said first clock signal only.

22. The switch circuit of claim 19 wherein said first and second PMOS transistors are placed in an N well, said N well being electrically coupled to said first terminal of said charge storage device.

23. The switch circuit of claim 22, wherein said charge storage device comprises a MOS capacitor implemented using a third PMOS transistor, said third PMOS transistor being placed in said N well.

24. The switch circuit of claim 19, wherein said first and second PMOS transistors are placed in a first N well and a second N well respectively, each of said first and second N wells being electrically coupled to said first terminal of said charge storage device.

25. The switch circuit of claim 24, wherein said charge storage device is a MOS capacitor implemented using a third PMOS transistor, said third PMOS transistor being placed in a third N well, said third N well being electrically coupled to said first terminal of said charge storage device.

26. The switch circuit of claim 22, wherein said second supply voltage is a power supply voltage of said switch circuit.

27. The switch circuit of claim 24, wherein said second supply voltage is a power supply voltage of said switch circuit.

28. The switch circuit of claim 19, wherein said first and second PMOS transistors have a maximum operating voltage and said second supply voltage is a voltage being a difference between said maximum operating voltage and a power supply voltage of said switch circuit.

29. The switch circuit of claim 19, wherein said switch circuit is manufactured using a dual-voltage fabrication process and said first and second PMOS transistors are high-voltage PMOS transistors.

30. The switch circuit of claim 15, wherein said switch circuit is manufactured using a dual-voltage fabrication process; and said second switch comprises:

a first high-voltage NMOS transistor having a first current handling terminal coupled to said second supply voltage, a second current handling terminal coupled to said first terminal of said charge storage device, and a gate terminal connected to a voltage signal corresponding to a voltage signal at said gate terminal of said first NMOS transistor; and a second high-voltage NMOS transistor having a first current handling terminal coupled to said gate terminal of said first NMOS transistor, a second current handling terminal coupled to first terminal of said charge storage device, and a gate terminal driven by said second clock signal.

31. The switch circuit of claim 15, wherein said third switch comprises a third NMOS transistor having a first current handling terminal coupled to said second terminal of said charge storage device, a second current handling terminal coupled to said first supply voltage, and a gate terminal driven by said first clock signal.

32. The switch circuit of claim 31, wherein said third switch further comprises a fourth NMOS transistor having a first current handling terminal coupled to said input terminal, a second current handling terminal coupled to said first current handling terminal of said third NMOS transistor, and a gate terminal driven by said second clock signal.

33. The switch circuit of claim 32, wherein said third switch further comprises a third PMOS transistor having a first current handling terminal coupled to said input terminal, a second current handling terminal coupled to said first current handling terminal of said third NMOS transistor, and a gate terminal driven by a signal corresponding to said second clock signal.

34. The switch circuit of claim 33, wherein said signal corresponding to said second clock signal is an inverse of said second clock signal.

35. The switch circuit of claim 31, wherein said third switch further comprises a fifth NMOS transistor having a first current handling terminal coupled to said input terminal, a second current handling terminal coupled to said first current handling terminal of said third NMOS transistor, and a gate terminal coupled to said gate terminal of said first NMOS transistor.

36. The switch circuit of claim 1, wherein said switching device comprises a first PMOS transistor having a first current handling terminal coupled to said input terminal, a second current handling terminal coupled to said output terminal, and a gate terminal being said control terminal of said switching device.

37. The switch circuit of claim 36, wherein said first supply voltage is a power supply voltage of said switch circuit and said second supply voltage is a ground voltage.

38. A method for selectively coupling an input voltage terminal to an output voltage terminal, comprising:

coupling a switching device between said input voltage terminal and said output voltage terminal;

precharging a charge storage device to a precharge voltage;

coupling said charge storage device between said input terminal and a control terminal of said switching device, causing said switching device to become conductive;

disconnecting said charge storage device from said input terminal and said control terminal of said switching device;

connecting said control terminal of said switching device to a first supply voltage, causing said switching device to become nonconductive;

coupling a capacitor divider circuit between said output terminal and said first supply voltage;

directing a channel charge from said control terminal of said switching device to a common node of said capacitor divider circuit; and generating a compensating charge at said output terminal, said compensating charge being derived from said channel charge and proportional to a ratio of capacitance values of said capacitor divider circuit;

wherein said compensating charge generated at said output terminal cancels an injected charge at said output terminal.

39. The switch circuit of claim 1, further comprising:

a fourth switch coupled between said first position of said first switch and said first supply voltage, said fourth switch having a first position being an open circuit and a second position coupling said first position of said first switch to said first supply voltage; and a capacitor divider circuit coupled between said output terminal and said first supply voltage, a common node of said capacitor divider circuit being coupled to said first position of said first switch;

wherein said fourth switch operates in response to said first clock signal and is in said first position when said switch circuit is turned off; and said capacitor divider circuit generates a compensating charge at said output terminal, said compensating charge being derived from a channel charge originated from said control terminal of said switching device when said switch circuit is turned off.

40. The switch circuit of claim 39, wherein said fourth switch comprises a first NMOS transistor having a first current handling terminal coupled to said first position of said first switch, a second current handling terminal coupled to said first supply voltage, and a gate terminal driven by an inverse of said first clock signal.

41. The switch circuit of claim 39, wherein said capacitor divider circuit comprises a first capacitor and a second capacitor having equal capacitance.

42. The switch circuit of claim 16, further comprising:

a third NMOS transistor having a first current handling terminal coupled to said second current handling terminal of said second NMOS transistor, a second current handling terminal coupled to said first supply voltage, and a gate terminal driven by an inverse of said first clock signal; and a capacitor divider circuit coupled between said output terminal and said first supply voltage, a common node of said capacitor divider circuit being coupled to said second current handling terminal of said second NMOS transistor;

wherein said third NMOS transistor is turned off when said switch circuit is turned off; and said capacitor divider circuit generates a compensating charge at said output terminal, said compensating charge being derived from a channel charge originated from said gate terminal of said first NMOS transistor when said switch circuit is turned off.

43. The switch circuit of claim 42, wherein said capacitor divider circuit comprises a first capacitor and a second capacitor having equal capacitance.

44. The switch circuit of claim 17, further comprising:

a fourth NMOS transistor having a first current handling terminal coupled to said second current handling terminal of said third NMOS transistor, a second current handling terminal coupled to said first supply voltage, and a gate terminal driven by an inverse of said first clock signal; and a capacitor divider circuit coupled between said output terminal and said first supply voltage, a common node of said capacitor divider circuit being coupled to said second current handling terminal of said third NMOS transistor;

wherein said fourth NMOS transistor is turned off when said switch circuit is turned off; and said capacitor divider circuit generates a compensating charge at said output terminal, said compensating charge being derived from a channel charge originated from said gate terminal of said first NMOS transistor when said switch circuit is turned off.

45. The switch circuit of claim 42, wherein said capacitor divider circuit comprises a first capacitor and a second capacitor having equal capacitance.

46. A method for canceling charge injection at an output terminal of a switch circuit said switch circuit comprising a switching device, said method comprising:

coupling a capacitor divider circuit between said output terminal of said switch circuit and a first supply voltage;

directing a channel charge from a control terminal of said switching device to a common node of said capacitor divider circuit; and generating a compensating charge at said output terminal of said switch circuit, said compensating charge being derived from said channel charge and proportional to a ratio of capacitance values of said capacitor divider circuit;

wherein said compensating charge generated at said output terminal cancels an injected charge at said output terminal.

47. The method of claim 46, wherein said capacitor divider circuit comprises a first capacitor and a second capacitor having equal capacitance.

48. A switch circuit for selectively coupling an input terminal to an output terminal comprising:

a switching device coupled between said input terminal and said output terminal, said switching device having a control terminal coupled to a control circuit for turning said switching device on or off;

a first switch coupled to said control terminal, said first switch having a first position being an open circuit and a second position coupled to a first supply voltage; and a capacitor divider circuit coupled between said output terminal and said first supply voltage, a common node of said capacitor divider circuit being coupled to said first switch;

wherein said first switch operates in response to a first clock signal and is in said first position when said switching device is turned off; and said capacitor divider circuit generates a compensating charge at said output terminal, said compensating charge being derived from a channel charge originated from said control terminal of said switching device when said switching device is turned off.

49. The method of claim 46, wherein said switching device comprises one of an NMOS transistor, a PMOS transistor, and a transmission gate comprising a parallel connection of an NMOS transistor and a PMOS transistor.

50. The method of claim 46, wherein said first supply voltage comprises a ground voltage.

51. The method of claim 48, wherein generating a compensating charge at said output terminal of said switch circuit comprises:

dividing said channel charge into half to generate said compensating charge.

52. The switch circuit of claim 48, wherein said switching device comprises one of an NMOS transistor, a PMOS transistor, and a transmission gate comprising a parallel connection of an NMOS transistor and a PMOS transistor.

53. The switch circuit of claim 48, wherein said first supply voltage comprises a ground voltage.

54. The switch circuit of claim 48, wherein said capacitor divider circuit comprises a first capacitor and a second capacitor having equal capacitance and said capacitor divider circuit divides said channel charge into half to generate said compensating charge.

* * * * *